(12) United States Patent
Weng

(10) Patent No.: US 8,772,790 B2
(45) Date of Patent: Jul. 8, 2014

(54) NITRIDE SEMICONDUCTOR LIGHT-EMITTING ELEMENT, NITRIDE SEMICONDUCTOR LIGHT-EMITTING DEVICE, AND METHOD OF MANUFACTURING NITRIDE SEMICONDUCTOR LIGHT-EMITTING ELEMENT

(75) Inventor: Yufeng Weng, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 10 days.

(21) Appl. No.: 13/591,959

(22) Filed: Aug. 22, 2012

(65) Prior Publication Data

US 2013/0049050 A1 Feb. 28, 2013

(30) Foreign Application Priority Data

Aug. 23, 2011 (JP) .................................. 2011-181767

(51) Int. Cl.
*H01L 27/14* (2006.01)
(52) U.S. Cl.
USPC ............................................ 257/79; 257/100
(58) Field of Classification Search
USPC .................................................. 257/79, 100
See application file for complete search history.

(56) References Cited

U.S. PATENT DOCUMENTS

| 7,291,865 B2 | 11/2007 | Kojima et al. | |
|---|---|---|---|
| 2006/0284209 A1* | 12/2006 | Kim et al. | 257/100 |
| 2009/0050926 A1* | 2/2009 | Suehiro et al. | 257/100 |

FOREIGN PATENT DOCUMENTS

| JP | 2006-108161 | 4/2006 |
|---|---|---|
| JP | 2006-120913 | 5/2006 |
| JP | 2011-71444 | 4/2011 |

* cited by examiner

*Primary Examiner* — Michael Shingleton
(74) *Attorney, Agent, or Firm* — Morrison & Foerster LLP

(57) ABSTRACT

A nitride semiconductor light-emitting device includes a nitride semiconductor light-emitting element, a package substrate and an optically transparent resin sealing portion. The nitride semiconductor light-emitting element includes a substrate, a nitride semiconductor multilayer portion having a light-emitting layer and a protective layer. The nitride semiconductor multilayer portion is provided on the substrate. The protective layer is provided on an upper portion of the nitride semiconductor multilayer portion. The resin sealing portion seals the nitride semiconductor light-emitting element that is mounted on the package substrate. An air gap layer is formed in at least one of an area between the substrate and the light-emitting layer in the nitride semiconductor light-emitting element, an area between the light-emitting layer and the protective layer in the nitride semiconductor light-emitting element and an area in the package substrate.

7 Claims, 13 Drawing Sheets

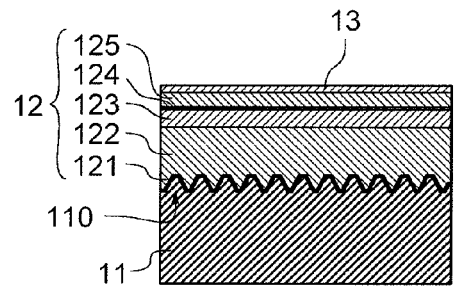
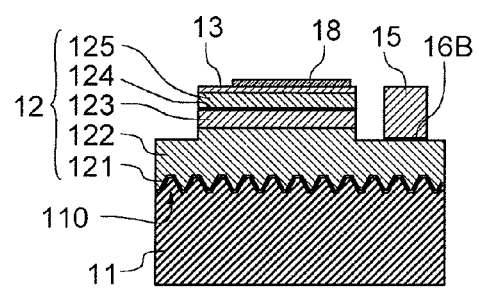
Fig.3A　　　　　　　Fig.3D
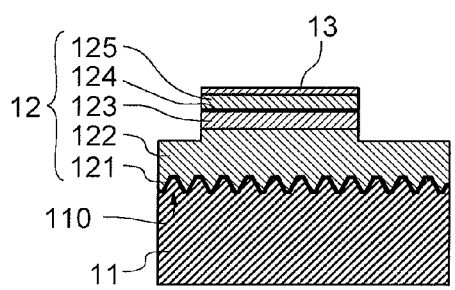
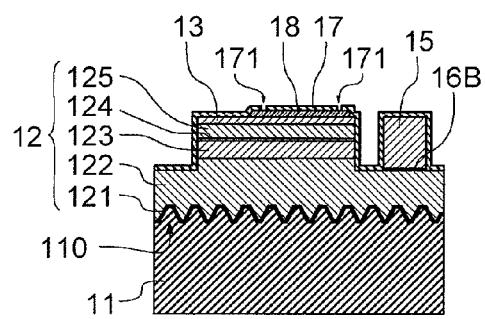
Fig.3B　　　　　　　Fig.3E
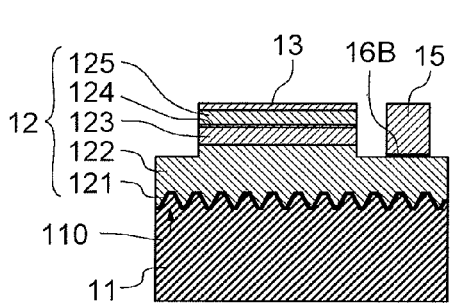
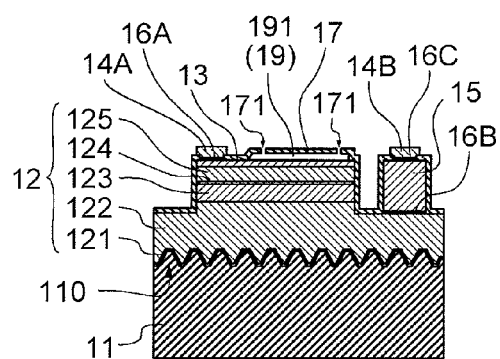
Fig.3C　　　　　　　Fig.3F

NITRIDE SEMICONDUCTOR LIGHT-EMITTING ELEMENT, NITRIDE SEMICONDUCTOR LIGHT-EMITTING DEVICE, AND METHOD OF MANUFACTURING NITRIDE SEMICONDUCTOR LIGHT-EMITTING ELEMENT

This application is based on Japanese Patent Application No. 2011-181767 filed in Japan on Aug. 23, 2011, the contents of which are hereby incorporated by reference.

BACKGROUND OF THE INVENTION

1. Field of the Invention

The present invention relates to a nitride semiconductor light-emitting element, a nitride semiconductor light-emitting device and a method of manufacturing a nitride semiconductor light-emitting element.

2. Description of the Related Art

Conventionally, in a general nitride semiconductor light-emitting element, on a sapphire substrate, an n-type nitride semiconductor layer, a nitride semiconductor light-emitting layer, a p-type nitride semiconductor layer and the like are sequentially provided. On each of the side of the n-type nitride semiconductor layer and the side of the p-type nitride semiconductor layer, an n-side electrode and a p-side electrode for connection with an external power supply are formed. On the substantially entire surface of the p-type nitride semiconductor layer, in order to assist current diffusion within the p-type nitride semiconductor layer, a transparent conductive film or the like formed with, for example, ITO (indium tin oxide) is deposited as a current diffusion layer.

Furthermore, on the upper portion of the current diffusion layer, a reflective film is deposited. This reflective film is provided in order to reflect light emitted from the nitride semiconductor light-emitting layer to the current diffusion layer toward the sapphire substrate and thereby enhance the efficiency of extracting light by the nitride semiconductor light-emitting element. The reflective film is generally formed with a metal material, such as Ag or Al, that has a high reflectivity. For example, JP-A-2011-71444 and JP-A-2006-108161 propose a nitride semiconductor light-emitting element in which a metal reflective film is formed through an insulating film on a transparent conductive film. Moreover, JP-A-2006-120913 proposes a nitride semiconductor light-emitting element in which a metal reflective film is formed on a transparent conductive film through a multiple reflective film formed with a plurality of dielectric layers.

However, when the metal reflective film is formed in the nitride semiconductor light-emitting element as in JP-A-2011-71444 and JP-A-2006-108161, a phenomenon called migration occurs due to the effects of as an electric field, an ambient humidity and the like acting on the metal reflective film, and thus a reliability problem occurs. When the multilayer reflective film is formed as in JP-A-2006-120913, since it is necessary to deposit a few tens of reflective films so as to obtain a high reflectivity, disadvantageously, it takes a long time, and it is uneconomical in terms of cost.

SUMMARY OF THE INVENTION

The present invention is made to overcome the above problem; an object of the present invention is to provide a nitride semiconductor light-emitting element including a reflective mirror in which its cost is low, its reflectivity is high and its reliability is high, a nitride semiconductor light-emitting device and a method of manufacturing a nitride semiconductor light-emitting element.

To achieve the above object, according to the present invention, there is provided a nitride semiconductor light-emitting element including: a substrate; a nitride semiconductor multilayer portion provided on the substrate; and a protective layer provided on an upper portion of the nitride semiconductor multilayer portion, in which the nitride semiconductor multilayer portion includes a light-emitting layer, and an air gap layer is formed in at least one of an area between the substrate and the light-emitting layer and an area between the light-emitting layer and the protective layer.

In the configuration described above, the reflective mirror including the air gap layer is formed in at least one of the area between the substrate and the light-emitting layer and the area between the light-emitting layer and the protective layer. The reflective mirror has a high reflectivity for the light emitted from the light-emitting layer. The reflective mirror has no metal reflective film. This prevents the reliability from being decreased due to the migration phenomenon. It is therefore possible to obtain the nitride semiconductor light-emitting element including the reflective mirror that has a low cost, a high reflectivity and a high reliability.

Alternatively, in the nitride semiconductor light-emitting element configured as described above, a current diffusion layer provided on the nitride semiconductor multilayer portion is further included, and the air gap layer is provided between the current diffusion layer and the protective layer.

In the configuration described above, the reflective mirror that is formed with "the current diffusion layer/the air gap layer/the protective layer" and that has a three-layer structure is formed. The refractive index contrast of the interface between the current diffusion layer and the reflective mirror is high. Hence, the reflective mirror has a high reflectivity for the light emitted from the light-emitting layer.

Alternatively, in the nitride semiconductor light-emitting element configured as described above, the nitride semiconductor multilayer portion further includes: a first nitride semiconductor layer provided between the substrate and the light-emitting layer; and a second nitride semiconductor layer provided between the light-emitting layer and the protective layer, and the air gap layer is formed in at least one of an area within the first nitride semiconductor layer and an area within the second nitride semiconductor layer.

In the configuration described above, the reflective mirror including the air gap layer is formed in at least one of the area within the first nitride semiconductor layer and the area within the second nitride semiconductor layer. Hence, the reflective mirror can be formed in a position closer to the light-emitting layer. Thus, the light emitted from the light-emitting layer can be more effectively reflected off the reflective mirror. It is therefore possible to more enhance the efficiency of utilizing the light emitted from the light-emitting layer.

Alternatively, in the nitride semiconductor light-emitting element configured as described above, a solid layer that is provided adjacent to the air gap layer in a direction of a normal to a main surface of the light-emitting layer is further included, and the solid layer has a high refractive index contrast for the air gap layer, and pairs with the air gap layer to form a reflective mirror.

In the configuration described above, the solid layer that is adjacent to the air gap layer in the direction of the normal to the main surface of the light-emitting layer and that has a high refractive index contrast for the air gap layer is provided. The solid layer pairs with the air gap layer to form a DBR (distributed bragg reflector) mirror functioning as the reflective mirror. Hence, in the interface between the air gap layer and the solid layer, a high refractive index contrast is obtained. It is therefore possible to further enhance the reflectivity of the reflective mirror for the light emitted from the light-emitting layer.

Alternatively, in the nitride semiconductor light-emitting element configured as described above, a joining electrode provided on an upper portion of the nitride semiconductor multilayer portion and a first highly reflective electrode layer provided between the nitride semiconductor multilayer portion and the joining electrode are further included.

In the configuration described above, the first highly reflective electrode layer is provided between the nitride semiconductor multilayer portion and the joining electrode. Hence, the light emitted from the light-emitting layer can be reflected off the first highly reflective electrode layer. It is therefore possible to prevent the light emitted from the light-emitting layer from being absorbed by the joining electrode.

Alternatively, in the nitride semiconductor light-emitting element configured as described above, the nitride semiconductor multilayer portion further includes a first nitride semiconductor layer provided between the substrate and the light-emitting layer, and the nitride semiconductor light-emitting element further includes: a contact electrode provided on an upper portion of the first nitride semiconductor layer; and a second highly reflective electrode layer provided between the first nitride semiconductor layer and the contact electrode.

In the configuration described above, the second highly reflective electrode layer is provided between the first nitride semiconductor layer and the contact electrode. Hence, the light emitted from the light-emitting layer can be reflected off the second highly reflective electrode layer. It is therefore possible to prevent the light emitted from the light-emitting layer from being absorbed by the contact electrode.

To achieve the above object, according to the present invention, there is provided a nitride semiconductor light-emitting device including: a nitride semiconductor light-emitting element including: a substrate; a nitride semiconductor multilayer portion provided on the substrate and having a light-emitting layer; and a protective layer provided on an upper portion of the nitride semiconductor multilayer portion; a package substrate on which the nitride semiconductor light-emitting element is mounted; and an optically transparent resin sealing portion that seals the nitride semiconductor light-emitting element mounted on the package substrate, in which an air gap layer is formed in at least one of an area between the substrate and the light-emitting layer in the nitride semiconductor light-emitting element, an area between the light-emitting layer and the protective layer in the nitride semiconductor light-emitting element and an area in the package substrate.

In the configuration described above, the reflective mirror including the air gap layer is formed in at least one of the area between the substrate and the light-emitting layer in the nitride semiconductor light-emitting element, the area between the light-emitting layer and the protective layer in the nitride semiconductor light-emitting element and the area in the package substrate. The reflective mirror has a high reflectivity for the light emitted from the light-emitting layer. The reflective mirror has no metal reflective film. This prevents the reliability from being decreased due to the migration phenomenon. It is therefore possible to obtain the nitride semiconductor light-emitting device including the reflective mirror that has a low cost, a high reflectivity and a high reliability.

To achieve the above object, according to the present invention, there is provided a method of manufacturing a nitride semiconductor light-emitting element including: a step of providing, on a substrate, a nitride semiconductor multilayer portion having a light-emitting layer; a step of providing a protective layer on an upper portion of the nitride semiconductor multilayer portion; and a step of forming an air gap layer in at least one of an area between the substrate and the light-emitting layer and an area between the light-emitting layer and the protective layer.

In the configuration described above, the reflective mirror including the air gap layer is formed in at least one of the area between the substrate and the light-emitting layer and the area between the light-emitting layer and the protective layer. The reflective mirror has a high reflectivity for the light emitted from the light-emitting layer. The reflective mirror has no metal reflective film. This prevents the reliability from being decreased due to the migration phenomenon. It is therefore possible to obtain the method of manufacturing the nitride semiconductor light-emitting element including the reflective mirror that has a low cost, a high reflectivity and a high reliability.

In the method of manufacturing the nitride semiconductor light-emitting element configured as described above, a step of providing a solid layer that is adjacent to the air gap layer in a direction of a normal to a main surface of the light-emitting layer, that has a high refractive index contrast for the air gap layer and that pairs with the air gap layer to form a reflective mirror may be further included.

In the configuration described above, the solid layer that is adjacent to the air gap layer in the direction of the normal to the main surface of the light-emitting layer and that has a high refractive index contrast for the air gap layer is provided. The solid layer pairs with the air gap layer to form the DBR mirror functioning as the reflective mirror. Hence, in the interface between the air gap layer and the solid layer, a high refractive index contrast is obtained. It is therefore possible to more enhance the reflectivity of the reflective mirror for the light emitted from the light-emitting layer.

BRIEF DESCRIPTION OF THE DRAWINGS

FIGS. 3A to 3F are cross-sectional views in the steps of manufacturing the nitride semiconductor light-emitting element of the first embodiment;

DETAILED DESCRIPTION OF THE PREFERRED EMBODIMENTS

Embodiments of the present invention will be described below with reference to accompanying drawings. Although some embodiments of the present invention are described below, specific configurations are not limited to those of the embodiments. Even when design modifications and the like are made without departing from the spirit of the present invention, they are included in the present invention.

<First Embodiment>

Figure 1:
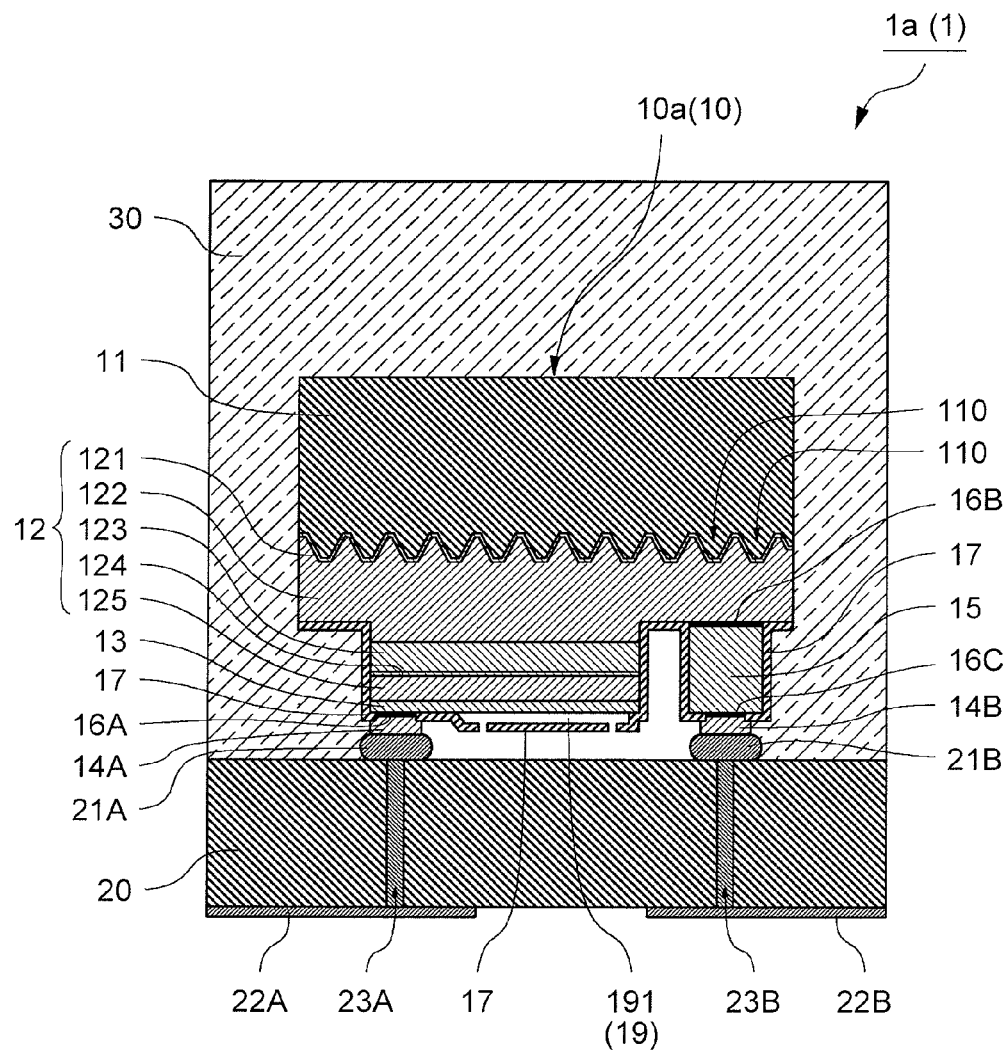
FIG. 1 is a cross-sectional view showing the structure of a nitride semiconductor light-emitting device according to a first embodiment.

FIG. 1 is a cross-sectional view showing the structure of a nitride semiconductor light-emitting device according to the first embodiment. As shown in FIG. 1, the nitride semiconductor light-emitting device 1a of the first embodiment includes a flip-chip nitride semiconductor light-emitting element 10a, a package substrate 20 and a resin sealing portion 30.

On one of the main surfaces of the package substrate 20, bumps 21A and 21B are provided. On the other main surface, a p-side wiring pattern 22A and an n-side wiring pattern 22B are provided. In the package substrate 20, through holes 23A and 23B that penetrate from one main surface to the other main surface are provided. Within the through holes 23A and 23B, conductive paths are formed. The bump 21A is electrically connected to the p-side wiring pattern 22A through the conductive path formed within the through hole 23A. The bump 21B is electrically connected to the n-side wiring pattern 22B through the conductive path formed within the through hole 23B.

On the one main surface of the nitride semiconductor light-emitting element 10a, a p-side joining electrode 14A and an n-side joining electrode 14B are provided. When the nitride semiconductor light-emitting element 10a is flip-chip mounted on the package substrate 20, the p-side joining electrode 14A of the nitride semiconductor light-emitting element 10a is electrically connected to the bump 21A on the package substrate 20. Furthermore, the n-side joining electrode 14B of the nitride semiconductor light-emitting element 10a is electrically connected to the bump 21B on the package substrate 20.

The resin sealing portion 30 seals the flip-chip nitride semiconductor light-emitting element 10a mounted on the one main surface of the package substrate 20. The material of the resin sealing portion 30 is preferably an optically transparent material; it is not particularly limited. The material of the resin sealing portion 30 may be a resin material. Alternatively, the material of the resin sealing portion 30 may be a composite resin material that contains a filling material having a high thermal conductivity, a fluorescent member and the like.

Figure 2:
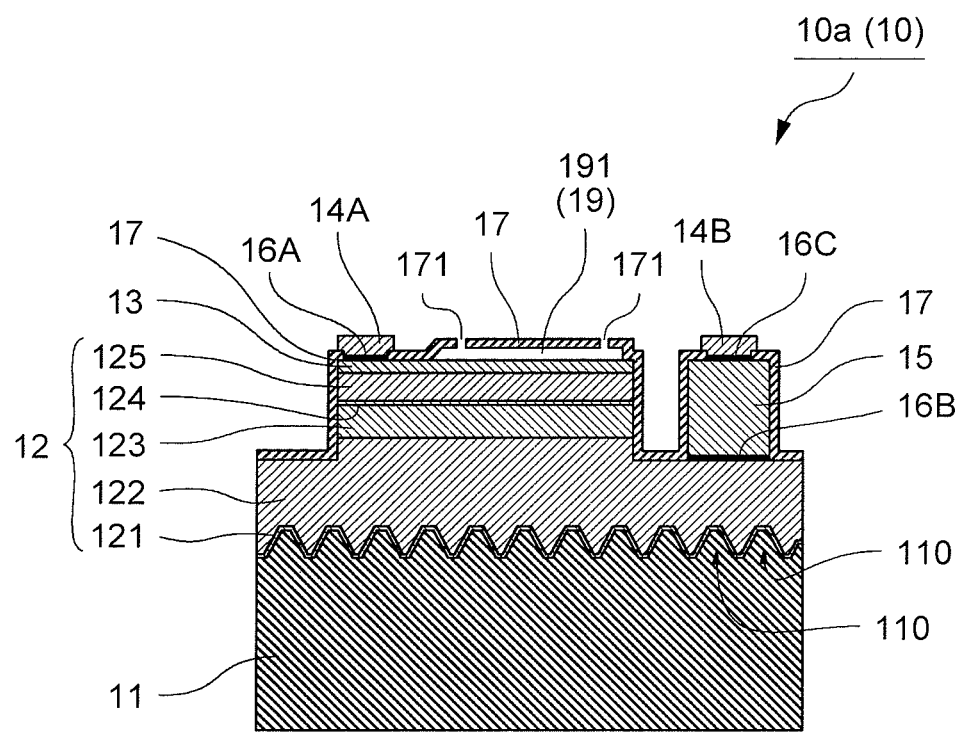
FIG. 2 is a cross-sectional view showing the structure of a nitride semiconductor light-emitting element according to the first embodiment.

The structure of the nitride semiconductor light-emitting element 10a according to the first embodiment will now be described in detail. FIG. 2 is a cross-sectional view showing the structure of the nitride semiconductor light-emitting element according to the first embodiment. As shown in FIG. 2, the nitride semiconductor light-emitting element 10a includes a substrate 11, a nitride semiconductor multilayer portion 12, a current diffusion layer 13, the p-side joining electrode 14A (joining electrode), the n-side joining electrode 14B, an n-side contact electrode 15 (contact electrode), a highly reflective electrode layers 16A to 16C, a protective layer 17 and an air gap layer 191. The nitride semiconductor multilayer portion 12 is composed of a plurality of nitride semiconductor layers formed with a nitride semiconductor ($In_xAl_yGa_{1-x-y}N$: $0 \leq x < 1$, $0 \leq y < 1$). The nitride semiconductor multilayer portion 12 includes a buffer layer 121, an n-type contact semiconductor layer 122 (part of a first nitride semiconductor layer), an n-type clad layer 123 (part of the first nitride semiconductor layer), a light-emitting layer 124 and a p-type semiconductor layer 125 (a second nitride semiconductor layer). The nitride semiconductor light-emitting element 10a is substantially rectangular when seen in the direction of a normal to its main surface. However, the shape of the nitride semiconductor light-emitting element 10a is not limited to this shape.

The substrate 11 is, for example, a sapphire substrate. The sapphire substrate has a main surface of (0001) plane direction. In the main surface of the substrate 11, a plurality of convex portions 110 are formed. The convex portion 110 is formed substantially in the shape of a circular truncated cone or a circular cone. The height of the convex portion 110 in the direction of the normal to the main surface of the substrate 11 is, for example, 0.6 μm. In plan view seen in the direction of the normal to the main surface of the substrate 11, the planar shape of the convex portion 110 in the main surface of the substrate 11 is, for example, a circle having a diameter of 1 μm. In plan view seen in the direction of the normal to the main surface of the substrate 11, the centers of the planar shapes of the individual convex portions 110 in the main surface of the substrate 11 are positioned in the individual apexes of imaginary regular triangles. The individual convex portions 110 are regularly arranged so as to be aligned in the directions of the three sides of the imaginary regular triangles. The pitch between the individual convex portions 110 is, for example, 2 μm. As described above, a plurality of convex portions 110 are formed in the main surface of the substrate 11, and thus it is possible to enhance the inside quantum effect of the nitride semiconductor light-emitting element 10a and the efficiency of extracting light.

Specifically, by a LEPS (lateral epitaxy on the patterned substrate) method, the nitride semiconductor multilayer portion 12 having a low dislocation density can be deposited on the main surface of the substrate 11. In the LEPS method, for example, a crystal preferentially grows substantially in the direction of the normal to the side surface of the convex portion 110. Hence, in the process of the crystal growth, a facet surface bends the dislocation inside a growing film. Consequently, in the process of the crystal growth, the propagation of the dislocation substantially in the direction of the normal to the main surface of the substrate 11 is inhibited. Hence, the dislocation density inside the growing film is reduced. It is therefore possible to enhance the inside quantum effect of the nitride semiconductor light-emitting element 10a.

The refractive index of the nitride semiconductor multilayer portion 12 is high. Hence, in general, light is more likely to be totally reflected within the nitride semiconductor light-emitting element. On the other hand, as in the nitride semiconductor light-emitting element 10a according to the present embodiment, a plurality of convex portions 110 are formed in the main surface of the substrate 11, and thus it is possible to reduce the scattering of light and the total reflection of light. Moreover, the pitch between the individual convex portions 110 is decreased, and thus it is possible to expect the diffraction effect of light. It is therefore possible to enhance the efficiency of extracting light by the nitride semiconductor light-emitting element 10a.

On the main surface of the substrate 11, the nitride semiconductor multilayer portion 12 is deposited by the LEPS method. Specifically, the n-type contact semiconductor layer 122 is deposited through the buffer layer 121 formed with AlN. On a predetermined region on the upper surface of the n-type contact semiconductor layer 122, the n-type clad layer 123 is deposited. In the following description, this region is referred to as a first region. On the upper portion of the n-type clad layer 123, the light-emitting layer 124 is deposited. The light-emitting layer 124 has a multiple quantum well structure. In the multiple quantum well structure, for example, a 3.5 nm thick n-type $In_{0.15}Ga_{0.85}N$ quantum well layer and, for example, a 6 nm thick Si-doped GaN barrier layer are alternately deposited six times. On the light-emitting layer 124, the p-type semiconductor layer 125 is deposited. The p-type semiconductor layer 125 is formed of Mg-doped nitride semiconductor ($In_xAl_yGa_{1-x-y}N$: $0 \leq x < 1$, $0 \leq y < 1$). On the p-type semiconductor layer 125, the current diffusion layer 13 is deposited. The current diffusion layer 13 is formed of, for example, ITO (indium tin oxide) having a thickness of 150 nm. On a region on the upper surface of the current diffusion layer 13, the p-side joining electrode 14A is provided through the highly reflective electrode layer 16A.

On a region on the upper surface of the n-type contact semiconductor layer 122 other than the first region, the n-side contact electrode 15 is provided through the highly reflective electrode layer 16B. The upper surface of the n-side contact electrode 15 is substantially as high as the upper surface of the current diffusion layer 13. Furthermore, on the n-side contact electrode 15, the n-side joining electrode 14B is provided through a highly reflective electrode layer 16C.

The highly reflective electrode layers 16A to 16C are reflective films that have a high reflectivity. The highly reflective electrode layers 16A to 16C are provided so that light emitted from the light-emitting layer 124 is not absorbed by the p-side joining electrode 14A, the n-side contact electrode 15 and the n-side joining electrode 14B. The highly reflective electrode layers 16A to 16C are formed of, for example, Al, AG, Pt, Rh or the like; the present invention is not limited to these substances. Preferably, the highly reflective electrode layers 16A to 16C have a high reflectivity for the light emitted from the light-emitting layer and is formed of a conductive material.

On the regions where the highly reflective electrode layers 16B and 16C are formed and the upper surface of the nitride semiconductor light-emitting element 10a other than the surfaces of the p-side joining electrode 14A and the n-side joining electrode 14B (in other words, on the main surface where the p-side joining electrode 14A and the n-side joining electrode 14B are provided), the protective layer 17 is provided. More specifically, the first region (the region where the n-type clad layer 123 is provided), the upper surface of the n-type contact semiconductor layer 122 other than the region where the highly reflective electrode layer 16B is provided, the side surface of the nitride semiconductor multilayer portion 12, the upper surface and the side surface of the current diffusion layer 13 other than the region where the highly reflective electrode layer 16A is provided and the upper surface and the side surface of the n-side contact electrode 15 other than the region where the highly reflective electrode layer 16C is provided are covered with the protective layer 17.

On a region on the upper surface of the current diffusion layer 13 other than the region where the highly reflective electrode layer 16A is provided, the air gap layer 191 is formed between the current diffusion layer 13 and the protective layer 17. In the following description, this region is referred to as a second region. The air gap layer 191 is an air gap that is provided between the current diffusion layer 13 and the protective layer 17. The thickness of the air gap layer 191 is approximately an odd multiple of $\{\lambda_o \times 1/(4n_{air})\}$. Here, $\lambda_o/n_{air}$ represents the wavelength of the light emitted from the light-emitting layer 124 in air. Also, $\lambda_o$ and $n_{air}$ respectively represent the wavelength of the light emitted in vacuum and the refractive index of the air gap layer 191 (in other words, air). In fact, the refractive index of the air is approximately one. Hence, the thickness of the air gap layer 191 is approximately an odd multiple of $\{\lambda_o \times \frac{1}{4}\}$, that is, approximately an odd multiple of one-fourth of the wavelength of the light emitted from the light-emitting layer 124 in vacuum.

The air gap layer 191 described above is formed, and thus a reflective mirror 19 having a three-layer structure is formed on the second region on the upper surface of the current diffusion layer 13. The reflective mirror 19 is formed with "the current diffusion layer 13/the air gap layer 191/the protective layer 17." In the reflective mirror 19 including the air gap layer 191 described above, the refractive index contrast of the interface between the current diffusion layer 13 and the air gap layer 191 is high. Hence, the reflective mirror 19 has a high reflectivity for the light emitted from the light-emitting layer 124. The reflective mirror 19 has no metal reflective film. This prevents the reliability from being decreased due to the migration phenomenon.

In the steps of manufacturing the air gap layer 191, as described later, a sacrifice layer 18 is formed on the second region on the upper surface of the current diffusion layer 13. Furthermore, the protective layer 17 is deposited. Thereafter, the sacrifice layer 18 is etched away. Hence, in the upper portion of the second region, openings 171 are formed in the protective layer 17. Although, in the present embodiment, the openings 171 are provided on the upper portion of the air gap layer 191, the openings 171 may be formed on the side of the air gap layer 191. Preferably, at least one opening 171 is provided either on the upper portion of or on the side of the air gap layer 191. The perimeter portion of the opening 171 may be coated with, for example, a fluorine resin. In this way, when the resin sealing portion 30 is formed, it is possible to prevent the material of the resin sealing portion 30 from entering the air gap layer 191 through the openings 171.

The method of manufacturing the nitride semiconductor light-emitting element 10a of the first embodiment will now be described. FIGS. 3A to 3F are cross-sectional views in the steps of manufacturing the nitride semiconductor light-emitting element of the first embodiment.

The substrate 1 having the main surface of (0001) plane direction is first prepared. A plurality of convex portions 110 are formed in the main surface of the substrate 11 by photolithography and etching. Then, as shown in FIG. 3A, on the main surface of the substrate 11 where the convex portions 110 are formed, the nitride semiconductor multilayer portion 12 is formed by the LEPS method.

Specifically, on the main surface of the substrate 11 where the convex portions 110 are formed, the buffer layer 121 is formed. Thereafter, the n-type contact semiconductor layer 122 and the n-type clad layer 123 (the first nitride semiconductor layer) are sequentially formed.

Under conditions in which the substrate temperature is about 890° C., on the n-type clad layer 123, the n-type $In_{0.15}Ga_{0.85}N$ quantum well layer is formed. Thereafter, the Si-doped GaN barrier layer is formed. These steps are alternately repeated six times. In this way, the light-emitting layer 124 having a multiple quantum well structure is formed.

Then, on the light-emitting layer 124, the p-type semiconductor layer 125 (the second nitride semiconductor layer) is formed. Thereafter, as the current diffusion layer 13, an ITO transparent conductive film having a thickness of 150 nm is formed on the p-type semiconductor layer 125 by sputtering. Here, the sheet resistance of the ITO transparent conductive film formed as the current diffusion layer 13 is measured. Consequently, the sheet resistance is about 200Ω/.

After the formation of the current diffusion layer 13, under conditions in which the substrate temperature is 600° C. in an atmosphere of a mixture gas composed of 2% of oxygen and 98% of nitrogen, first anneal processing is performed for 10 minutes. Thereafter, the transmittance of the ITO transparent conductive film formed as the current diffusion layer 13 is measured. Consequently, the transmittance for light having a wavelength of 450 nm is increased to 94% or more.

After the completion of the first anneal processing, the current diffusion layer 13 is temporarily exposed to the atmosphere. Thereafter, the current diffusion layer 13 is returned again to a furnace, and, under conditions in which the substrate temperature is 500° C. in vacuum, second anneal processing is performed for 5 minutes. Then, the sheet resistance of the ITO film formed as the current diffusion layer 13 is measured. Consequently, the sheet resistance is decreased to 11Ω/. As described above, the second anneal processing is performed, and thus it is possible to decrease the sheet resistance of the ITO transparent conductive film formed as the current diffusion layer 13.

After the second anneal processing, a region on the upper surface of the current diffusion layer 13 is partially etched by photolithography. By first etching processing, as shown in FIG. 3B, the current diffusion layer 13, the p-type semiconductor layer 125, the light-emitting layer 124, the n-type clad layer 123 and the n-type contact semiconductor layer 122 are partially removed. Here, in plan view perpendicularly from above the upper surface of the current diffusion layer 13, the regions other than the first region on the upper surface of the n-type contact semiconductor layer 122 are exposed. The first region is the region on which the n-type clad layer 123 is deposited.

On a region of the exposed region on the n-type contact semiconductor layer 122, as shown in FIG. 3C, the n-side contact electrode 15 is provided. Between the n-type contact semiconductor layer 122 and the n-side contact electrode 15, the highly reflective electrode layer 16B is provided. These layers are formed, utilizing photolithography, by electron-beam deposition and a lift-off method. For example, photolithography is used to form a photoresist pattern on the regions other than the region where the highly reflective electrode layer 16B is formed (that is, a region of the region where the n-type contact semiconductor layer 122 is exposed) on the main surface of the nitride semiconductor light-emitting element 10a in the state shown in FIG. 3B. Then, the highly reflective electrode layer 16B and the n-side contact electrode 15 are sequentially deposited by electron-beam deposition. The n-side contact electrode 15 is deposited such that the upper surface of the n-side contact electrode 15 is substantially as high as the upper surface of the current diffusion layer 13. Thereafter, by the lift-off method, the highly reflective electrode layer 16B and the n-side contact electrode 15 formed on the photoresist pattern are removed together with the photoresist pattern.

Then, as shown in FIG. 3D, the sacrifice layer 18 is formed on the region (the second region) on the upper surface of the current diffusion layer 13. The thickness of the sacrifice layer 18 is set at approximately an odd multiple of $\{\lambda_o \times 1/(4n_{air})\}$. Here, $\lambda_o/n_{air}$ represents the wavelength of the light emitted from the light-emitting layer 124 in air. Also, $\lambda_o$ and $n_{air}$ respectively represent the wavelength of the light emitted in vacuum and the refractive index of the air. In fact, the refractive index of the air is approximately one. Hence, the thickness of the sacrifice layer 18 is set at approximately an odd multiple of $\{\lambda_o \times \frac{1}{4}\}$, that is, approximately an odd multiple of one-fourth of the wavelength of the light emitted from the light-emitting layer 124 in vacuum. Then, as shown in FIG. 3E, by plasma chemical vapor deposition (PCVD), on the entire upper surface of the nitride semiconductor light-emitting element 10a, the protective layer 17 is formed. Examples of the material of the sacrifice layer 18 include Si, Al and Cu; the present invention is not limited to these substances. The material of the sacrifice layer 18 is preferably a material that significantly differs in the etching characteristic from the protective layer 17 and the current diffusion layer 13. As the material of the protective layer 17, a photoresist material may be used as long as heat is not applied in the process of forming the protective layer 17.

In the process of forming the protective layer 17, the openings 171 for removing the sacrifice layer 18 by etching on the upper portion of or the side of the sacrifice layer 18 are provided in the protective layer 17. In the present embodiment, two openings 171 are formed. On the other hand, the present invention is not limited to this. On the upper portion of or the side of the sacrifice layer 18, at least one opening 171 is preferably formed in the protective layer 17. After the formation of the openings 171 in the protective layer 17, the perimeter portion of the opening 171 may be coated with, for example, a fluorine resin. In this way, when the resin sealing portion 30 is formed, it is possible to prevent the material of the resin sealing portion 30 from entering the air gap layer 191 through the openings 171.

After the formation of the protective layer 17, as shown in FIG. 3F, by photolithography, the sacrifice layer 18 is etched away. By this etching processing, the air gap layer 191 is formed on the second region on the upper surface of the current diffusion layer 13. Hence, the thickness of the air gap layer 191 is approximately an odd multiple of $\{\lambda_o \times 1/(4n_{air})\}$. In fact, the refractive index of the air is approximately one. Hence, the thickness of the air gap layer 191 is approximately an odd multiple of $\{\lambda_o \times \frac{1}{4}\}$. Thus, on the second region on the upper surface of the current diffusion layer 13, the reflective mirror 19 having a three-layer structure is formed. The reflective mirror 19 is formed with "the current diffusion layer 13/the air gap layer 191/the protective layer 17." In the reflective mirror 19 including the air gap layer 191 described above, the refractive index contrast of the interface between the current diffusion layer 13 and the air gap layer 191 is high. Hence, the reflective mirror 19 has a high reflectivity for the light emitted from the light-emitting layer 124.

Then, by electron-beam deposition and photolithography, as shown in FIG. 3F, on a region other than the second region on the upper surface of the current diffusion layer 13, the protective layer 17 is removed. Furthermore, the highly reflective electrode layer 16A and the p-side joining electrode 14A are sequentially provided. Likewise, by electron-beam deposition and photolithography, as shown in FIG. 3F, on a region on the upper surface of the n-side contact electrode 15, the protective layer 17 is removed. Furthermore, the highly reflective electrode layer 16C and the n-side joining electrode 14B are sequentially provided. Here, the p-side joining electrode 14A and the n-side joining electrode 14B are provided such that the upper surface of the p-side joining electrode 14A is substantially as high as the upper surface of the n-side joining electrode 14B.

As described above, in the first embodiment, it is possible to obtain the substantially rectangular flip-chip nitride semiconductor light-emitting element 10a having the reflective mirror 19 that is formed with "the current diffusion layer 13/the air gap layer 191/the protective layer 17" and that has a three-layer structure.

Figure 4A:
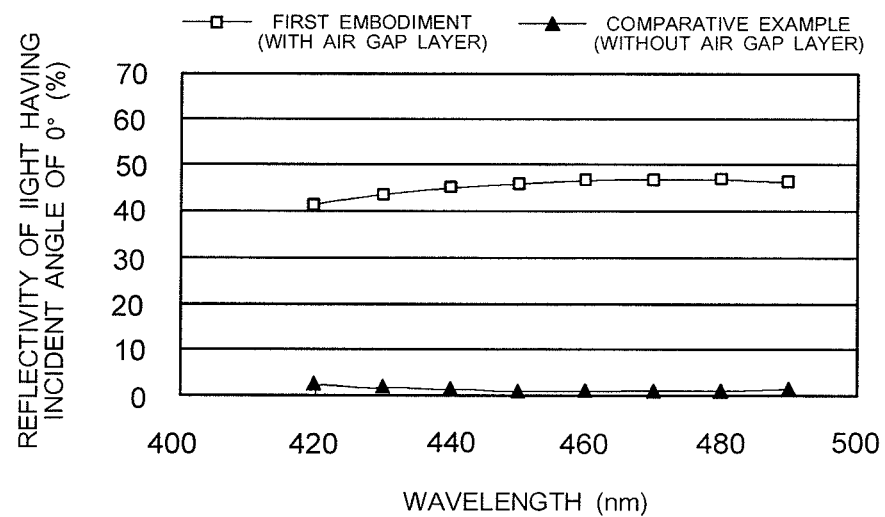
FIGS. 4A and 4B are graphs showing the characteristic of the reflectivity of a reflective mirror according to the first embodiment.
Figure 4B:
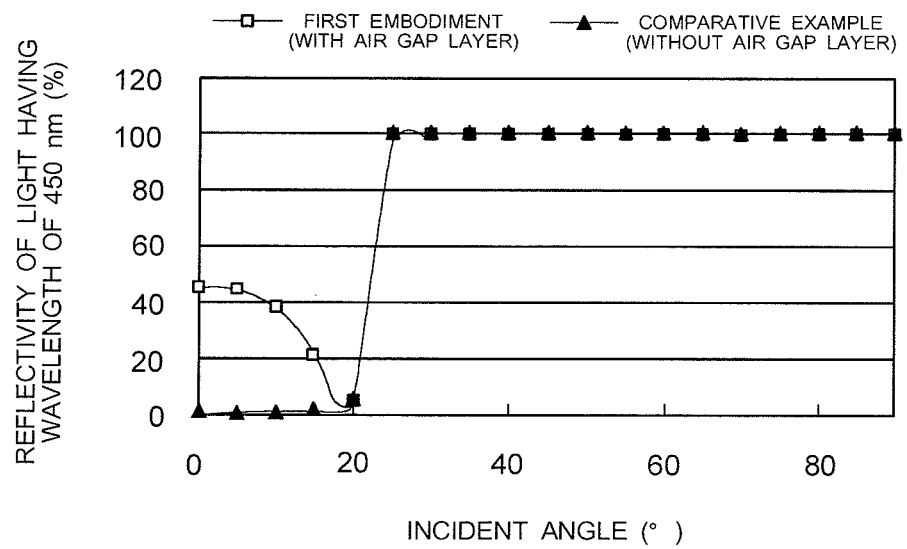

The reflectivity characteristic of the reflective mirror 19 according to the first embodiment will now be described by comparison with a comparative example where no air gap layer is formed. FIGS. 4A and 4B are graphs showing the characteristic of the reflectivity of the reflective mirror according to the first embodiment. FIG. 4A is the graph showing the result of a simulation of the reflectivity of the reflective mirror with respect to light of wavelengths incident at an angle of 0°. FIG. 4B is the graph showing the result of a simulation of the reflectivity of the reflective mirror with respect to light having a wavelength of 450 nm incident at different angles. As shown in FIG. 4A, the reflective mirror 19 of the first embodiment has a high reflectivity of about 40% or more with respect to light in the wavelength range of 420 to 490 nm incident at an angle of 0°. By contrast, in the comparative example where no air gap layer is formed, a low reflectivity of 3% or less is only obtained. On the result of the measurement of the reflectivity for the incident angle of light, likewise, with respect to light having a wavelength of 450 nm incident at an angle of less than 20°, as shown in FIG. 4B, the reflective mirror 19 of the first embodiment has a higher reflectivity than in the comparative example where no air gap layer is formed.

As described above, in the nitride semiconductor light-emitting device 1a of the first embodiment, the air gap layer 191 is provided between the current diffusion layer 13 and the protective layer 17 in the nitride semiconductor light-emitting element 10a. In this way, the reflective mirror 19 that is formed with "the current diffusion layer 13/the air gap layer 191/the protective layer 17" and that has a three-layer structure is formed. The refractive index contrast of the interface between the current diffusion layer 13 and the air gap layer 191 is high. Hence, the reflective mirror 19 has a high reflectivity for the light emitted from the light-emitting layer 124.

Although, in the first embodiment described above, the air gap layer 191 is formed between the current diffusion layer 13 and the protective layer 17, the present invention is not limited to this configuration. Preferably, in the nitride semiconductor light-emitting element 10a, the air gap layer 191 is formed in at least one of an area between the substrate 11 and the light-emitting layer 124 and an area between the light-emitting layer 124 and the protective layer 17. For example, the air gap layer 191 may be formed either between the p-type semiconductor layer 125 and the current diffusion layer 13 or within the p-type semiconductor layer 125. Alternatively, the air gap layer 191 may be provided either within the n-type contact semiconductor layer 122 or within the n-type clad layer 123 or between the n-type contact semiconductor layer 122 and the n-type clad layer 123.

In this way, it is possible to form the reflective mirror 19 including the air gap layer 191 in at least one of the area between the substrate 11 and the light-emitting layer 124 and the area between the light-emitting layer 124 and the protective layer 17. The reflective mirror 19 has a high reflectivity for the light emitted from the light-emitting layer 124. The reflective mirror 19 has no metal reflective film. This prevents the reliability from being decreased due to the migration phenomenon. It is therefore possible to obtain the nitride semiconductor light-emitting element 10a including the reflective mirror that has a low cost, a high reflectivity and a high reliability, the nitride semiconductor light-emitting device 1a and the method of manufacturing the nitride semiconductor light-emitting element 10a.

Although, in the first embodiment described above, one air gap layer 191 is formed, a plurality of air gap layers 191 may be formed in at least two areas or more among areas between the substrate 11 and the light-emitting layer 124 and between the light-emitting layer 124 and the protective layer 17. In this way, a plurality of reflective mirrors 19 including the air gap layer 191 are formed. It is therefore possible to further enhance the efficiency of utilizing the light emitted from the light-emitting layer 124.

<Second Embodiment>

Figure 5:
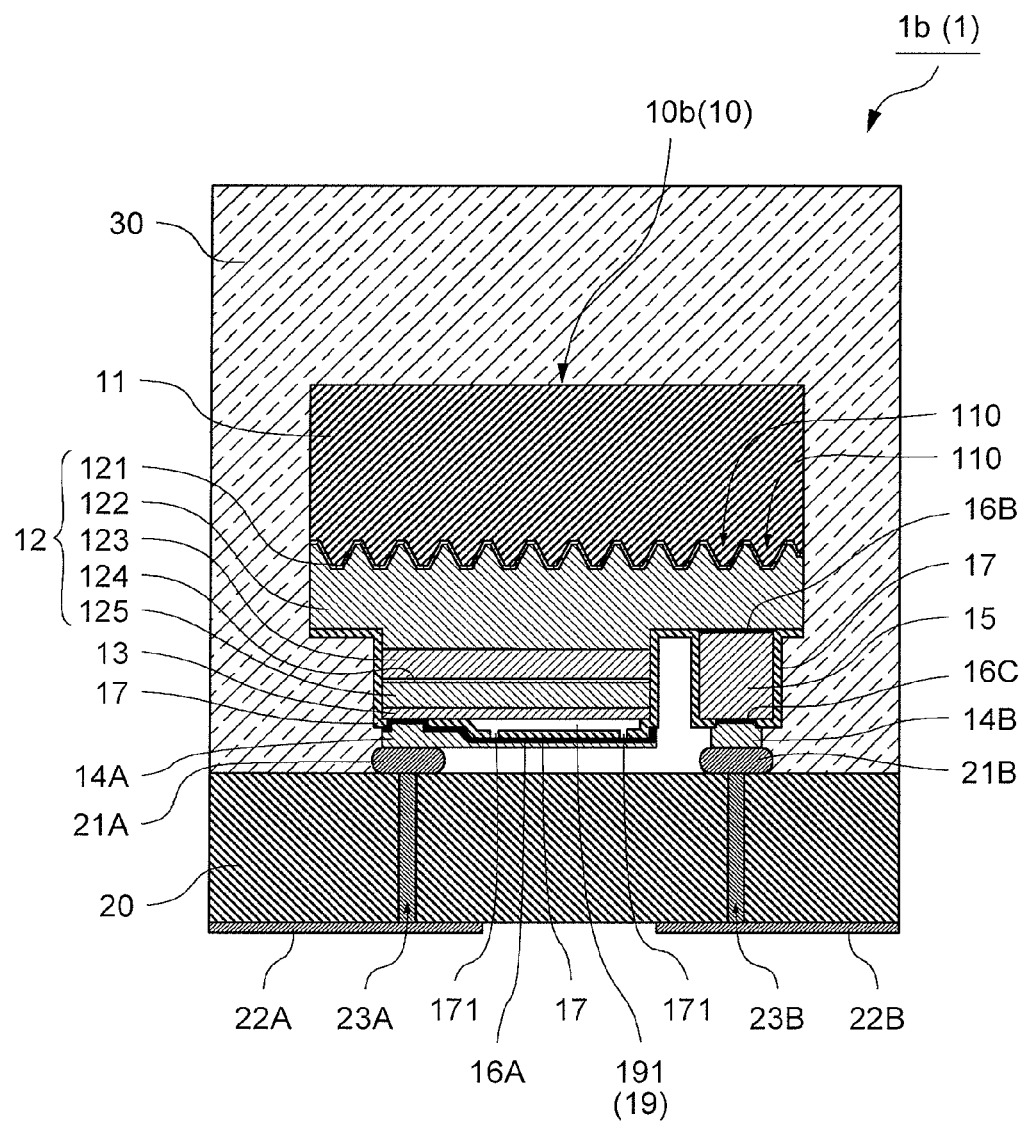
FIG. 5 is a cross-sectional view showing the structure of a nitride semiconductor light-emitting device according to a second embodiment.

A nitride semiconductor light-emitting device 1b of a second embodiment will now be described. FIG. 5 is a cross-sectional view showing the structure of the nitride semiconductor light-emitting device according to the second embodiment. In the second embodiment, in addition to the region on the upper surface of the current diffusion layer 13 of the nitride semiconductor light-emitting device 1b, on the protective layer 17, the highly reflective electrode layer 16A and the p-side joining electrode 14A are sequentially provided. Except this point, the second embodiment is the same as the first embodiment. The second embodiment will be describe below; the same or corresponding portions as or to those of the first embodiment are identified with like symbols. Their description will not be repeated.

In the nitride semiconductor light-emitting device 1b of the second embodiment, as shown in FIG. 5, in a nitride semiconductor light-emitting element 10b, on the upper portion of the reflective mirror 19 that is formed with "the current diffusion layer 13/the air gap layer 191/the protective layer 17" and that has a three-layer structure, the highly reflective electrode layer 16A is further provided. In this way, the light emitted from the light-emitting layer 124 is reflected off not only the reflective mirror 19 but also the highly reflective electrode layer 16A. It is therefore possible to further enhance the efficiency of utilizing the light emitted from the light-emitting layer 124.

Although, in the second embodiment described above, the air gap layer 191 is provided between the current diffusion layer 13 and the protective layer 17, the present invention is not limited to this configuration. Preferably, the air gap layer 191 is formed in at least one of the area between the substrate 11 and the light-emitting layer 124 and the area between the light-emitting layer 124 and the protective layer 17. A plurality of air gap layers 191 may be formed in at least two areas or more among the areas between the substrate 11 and the light-emitting layer 124 and between the light-emitting layer 124 and the protective layer 17.

<Third Embodiment>

Figure 6:
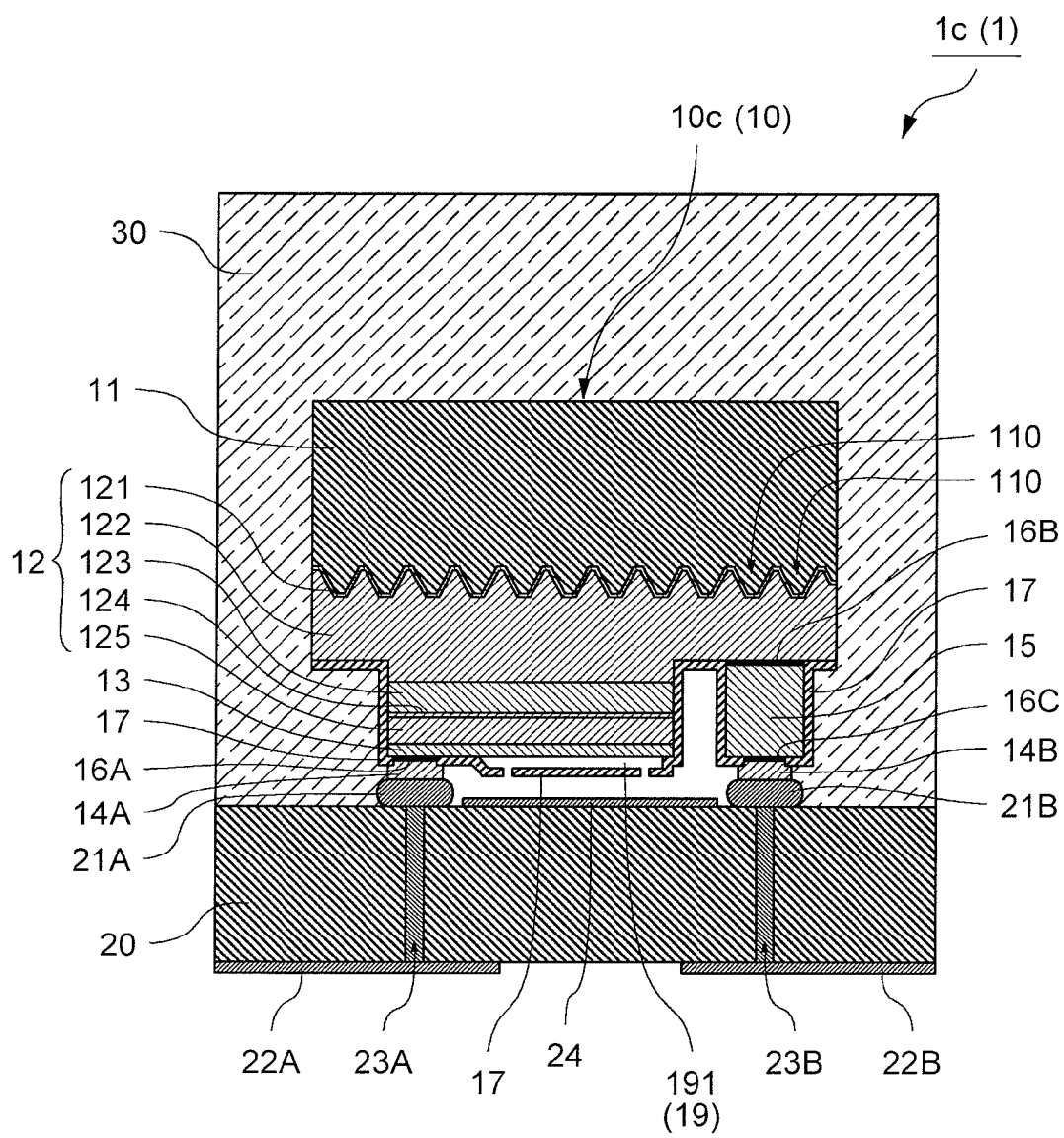
FIG. 6 is a cross-sectional view showing the structure of a nitride semiconductor light-emitting device according to a third embodiment.

A nitride semiconductor light-emitting device 1c of a third embodiment will now be described. FIG. 6 is a cross-sectional view showing the structure of the nitride semiconductor light-emitting device according to the third embodiment. In the third embodiment, a highly reflective film 24 for reflecting the light emitted from the light-emitting layer 124 is provided on the main surface of the package substrate 20. Except this point, the third embodiment is the same as the first embodiment. The same or corresponding portions as or to those of the first embodiment are identified with like symbols. Their description will not be repeated.

In the nitride semiconductor light-emitting device 1c, the highly reflective film 24 is provided on the main surface of the package substrate 20. Hence, the light emitted from the light-emitting layer 124 is also reflected off the highly reflective film 24 provided on the main surface of the package substrate 20. It is therefore possible to further enhance the efficiency of utilizing the light emitted from the light-emitting layer 124. As the material of the highly reflective film 24, for example, Al, AG, Pt or Rh can be used; the present invention is not limited to these substances. The material of the highly reflective film 24 is preferably a material that has a high reflectivity for the light emitted from the light-emitting layer 124.

As a variation of the third embodiment, the highly reflective film 24 described above may be provided on the main surface of the package substrate 20 of the nitride semiconductor light-emitting device 1b according to the second embodiment.

Although, in the third embodiment described above, the air gap layer 191 is provided between the current diffusion layer 13 and the protective layer 17, the present invention is not limited to this configuration. Preferably, the air gap layer 191 is formed in at least one of the area between the substrate 11 and the light-emitting layer 124 and the area between the light-emitting layer 124 and the protective layer 17. A plurality of air gap layers 191 may be formed in at least two areas or more among the areas between the substrate 11 and the light-emitting layer 124 and between the light-emitting layer 124 and the protective layer 17.

<Fourth Embodiment>

Figure 7:
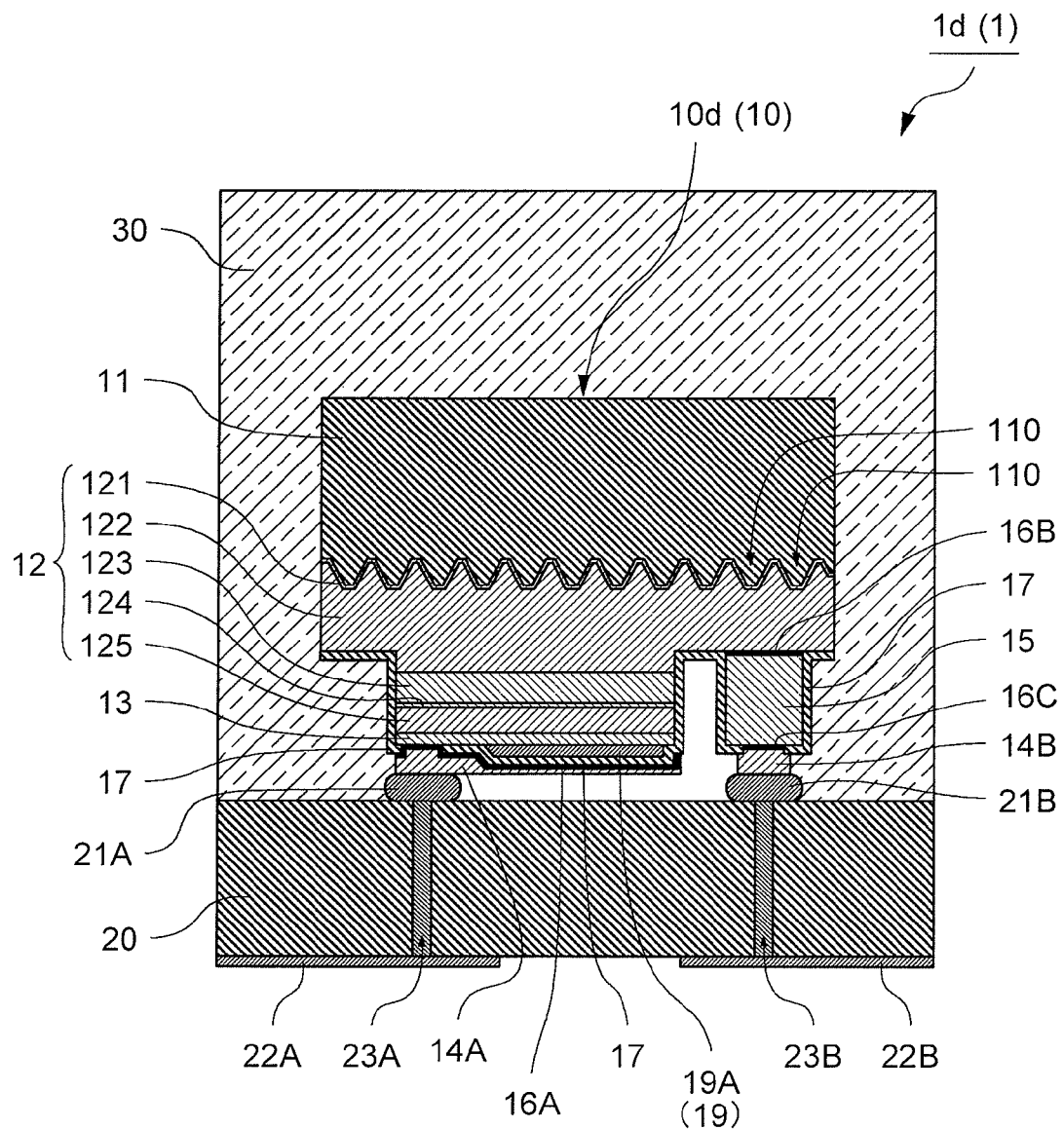
FIG. 7 is a cross-sectional view showing the structure of a nitride semiconductor light-emitting device according to a fourth embodiment.

A nitride semiconductor light-emitting device 1d of a fourth embodiment will now be described. FIG. 7 is a cross-sectional view showing the structure of the nitride semiconductor device according to the fourth embodiment. In the fourth embodiment, a nitride semiconductor light-emitting element 10d further includes a solid layer 192. The solid layer 192 is provided adjacent to the air gap layer 191 in the direction of a normal to the main surface of the light-emitting layer 124 between the current diffusion layer 13 and the protective layer 17. The solid layer 192 is formed of a material that has a high refractive index contrast for the air gap layer 191. The solid layer 192 pairs with the air gap layer 191 to form a DBR (distributed bragg reflector) mirror 19A functioning as the reflective mirror 19. The air gap layer 191 and the solid layer 192 are alternately provided in the direction of the normal to the main surface of the light-emitting layer 124. Except this point, the fourth embodiment is the same as the first embodiment. The fourth embodiment will be described below; the same or corresponding portions as or to those of the first embodiment are identified with like symbols. Their description will not be repeated.

Figure 8:
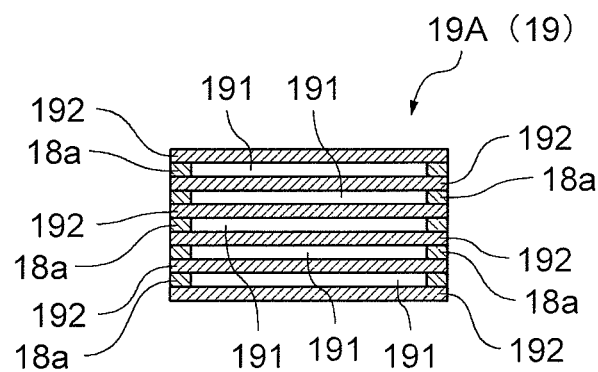
FIG. 8 is a diagram showing the structure of an example of a DBR mirror that is formed by the pairing of an air gap layer with a solid layer.

FIG. 8 is a diagram showing the structure of an example of the DBR mirror that is formed by the pairing of the air gap layer with the solid layer. In FIG. 8, five air gap layers 191 and six solid layers 192 are alternately provided in the following order: (solid layer 192)$_1$/(air gap layer 191)$_1$/(solid layer 192)$_2$/ . . . /(solid layer 192)$_5$/(air gap layer 191)$_5$/(solid layer 192)$_6$. They are provided adjacent to each other in the direction of the normal to the main surface of the light-emitting layer 124. Hence, on the second region on the upper surface of the current diffusion layer 13, the DBR mirror 19A composed of five pairs of air gap layers 191 and solid layers 192 is formed. In other words, on the second region on the upper surface of the current diffusion layer 13, the DBR mirror 19A is formed that is formed with "the current diffusion layer 13/the five pairs of (air gap layers 191 and solid layers 192)/ the protective layer 17" and that has a multi-layer structure. A part of sacrifice layer 18a, which will be described later, is left in each of the air gap layers 191. Since the part of sacrifice layer 18a supports the layers on and below the air gap layer 191, the air gap layer 191 is unlikely to be broken.

The thickness of each air gap layer 191 of the DBR mirror 19A is approximately an odd multiple of $\{\lambda_o \times 1/(4n_{air})\}$. Here, $\lambda_o/n_{air}$ represents the wavelength of the light emitted from the light-emitting layer 124 in air. Also, $\lambda_o$ and $n_{air}$ respectively represent the wavelength of the light emitted in vacuum and the refractive index of the air gap layer 191 (that is, the air). In fact, the refractive index of the air is approximately one; hence, the thickness of the air gap layer 191 is approximately an odd multiple of $\{\lambda_o \times \frac{1}{4}\}$. The thickness of each solid layer 192 of the DBR mirror 19A is approximately an odd multiple of $\{\lambda_o \times 1/(4n_{sc})\}$. Here, $\lambda_o/n_{sc}$ represents the wavelength of the light emitted from the light-emitting layer 124 in the solid layer 192. Also, $\lambda_o$ and $n_{sc}$ respectively represent the wavelength of the light emitted in vacuum and the refractive index of the solid layer 192.

When, as in the fourth embodiment, the solid layer 192 is formed between the current diffusion layer 13 and the protective layer 17, sputtering, electron-beam deposition or the like is generally used. Hence, in the fourth embodiment, the solid layer 192 is formed of a dielectric material (especially, a dielectric material having excellent optical characteristics) such as $SiO_2$, $SiN$, $TiO_2$ or like.

When, as described above, the solid layers 192 are provided such that the solid layers 192 and the air gap layers 191 are alternately adjacent to each other in the direction of the normal to the main surface of the light-emitting layer 124, the air gap layers 191 pair with the solid layers 192 to form the DBR mirror 19A functioning as the reflective mirror 19. Hence, in the interface between the air gap layer 191 and the solid layer 192, a high refractive index contrast is obtained. It is therefore possible to further enhance the reflectivity of the DBR mirror 19A for the light emitted from the light-emitting layer 124. Furthermore, in the DBR mirror 19A, as compared with a conventional DBR mirror, it is possible to obtain a high reflectivity even when the number of layers (or the number of pairs) is low.

The numbers and the alignment of air gap layers 191 and solid layers 192 that constitute the DBR mirror 19A and the number of pairs of air gap layers 191 and solid layers 192 are not limited to those of the example of FIG. 8. Preferably, one or more of air gap layers 191 and one or more of solid layers 192 are used. For example, m (an integer of one or more) air gap layers 191 and (m−1) solid layers 192 may be provided alternately and adjacently in the direction of the normal to the main surface of the light-emitting layer 124 in the following order: (air gap layer 191)$_1$/(solid layer 192)$_1$/(air gap layer 191)$_2$/(solid layer 192)$_2$/ . . . /(solid layer 192)$_{m-1}$/(air gap layer 191)$_m$. Alternatively, for example, m air gap layers 191 and m solid layers 192 may be provided alternately and adjacently on the current diffusion layer 13 in the direction of the normal to the main surface of the light-emitting layer 124 in the following order: (air gap layer 191)$_1$/(solid layer 192)$_1$/ (air gap layer 191)$_2$/ (solid layer 192)$_2$/ . . . /(air gap layer 191)$_m$/(solid layer 192)$_m$.

In the nitride semiconductor light-emitting element 10d having the DBR mirror 19A described above, in its manufacturing steps, a step of forming the sacrifice layer 18 and a step of forming the reflective mirror 19 are repeatedly performed on the second region on the upper surface of the current diffusion layer 13. Thereafter, a step of removing the sacrifice layer 18 by etching is performed.

For example, as in the first embodiment, the step of forming the sacrifice layer 18 is performed on the second region on the current diffusion layer 13. Thereafter, the solid layer 192 is formed on the surface (for example, the upper surface and the side surface) of the sacrifice layer 18, utilizing photolithography, by sputtering or electron-beam deposition and the lift-off method. Here, on the upper portion or the side of each sacrifice layer 18, openings (unillustrated) for removing the sacrifice layers 18 by etching are provided in the solid layer 192. As described above, a step of forming the sacrifice layer 18 on the formed solid layer 192 and a step of forming the solid layer 192 are repeatedly performed.

Then, desired numbers of sacrifice layers 18 and solid layers 192 are alternately formed in a desired order. Thereafter, an alternate deposition structure of the sacrifice layers 18 and the solid layers 192 is patterned by the lift-off method and etching utilizing photolithography. Then, the sacrifice layers 18 are removed by wet etching, and thus the air gap layers 191 are formed. Here, an etching solution having an etching rate selectivity for the sacrifice layer 18 and the solid layer 192 is used. Specifically, the etching solution in which an etching rate for the sacrifice layer 18 is higher than that for the solid layer 192 is used to form the air gap layer 191. When wet etching is performed to remove the sacrifice layers 18, wet etching is performed so as to leave the part 18a of the sacrifice layer 18. In this way, within the air gap layer 191, the remaining part 18a of the sacrifice layer 18 can support the layers on and below the air gap layer 191. It is therefore possible to prevent the air gap layer 191 from being easily broken.

As described above, the desired numbers of air gap layers 191 and solid layers 192 are alternately formed in the desired order, and thus the air gap layers 191 pair with the solid layers 192 to form the DBR mirror 19A functioning as the reflective mirror 19. Thereafter, plasma chemical vapor deposition (PCVD) is performed to form the protective layer 17 on the entire upper surface of the nitride semiconductor light-emitting element 10d.

The thickness of each sacrifice layer 18 (in other words, the thickness of each air gap layer 191) formed in the fourth embodiment is set at approximately an odd multiple of $\{\lambda_o \times 1/(4n_{air})\}$. In fact, the refractive index of the air is approximately one. Hence, the thickness of each sacrifice layer 18 is set at approximately an odd multiple of $\{\lambda_o \times \frac{1}{4}\}$. The thickness of each solid layer 192 is set at approximately an odd multiple of $\{\lambda_o \times 1/(4n_{sc})\}$. In the fourth embodiment, as the material of the sacrifice layer 18, a dielectric material (especially, a dielectric material having excellent optical characteristics) that has an etching characteristic significantly different from that of the solid layer 192 is used.

In a variation of the fourth embodiment, as in the second embodiment, in addition to the region on the upper surface of the current diffusion layer 13, on the protective layer 17, the highly reflective electrode layer 16A and the p-side joining electrode 14A may be sequentially provided. Furthermore, in a variation of the fourth embodiment, the same highly reflective film 24 as in the third embodiment may be provided on the main surface of the package substrate 20. In this way, the light emitted from the light-emitting layer 124 is reflected off the highly reflective electrode layer 16A and the highly reflective film 24 provided on the main surface of the package substrate 20. It is therefore possible to further enhance the efficiency of utilizing the light emitted from the light-emitting layer 124.

Although, in the fourth embodiment described above, between the current diffusion layer 13 and the protective layer 17, the DBR mirror 19A composed of the air gap layers 191 and the solid layers 192 is formed, the DBR mirror 19A may be formed, for example, within the p-type semiconductor layer 125.

<Fifth Embodiment>

Figure 9:
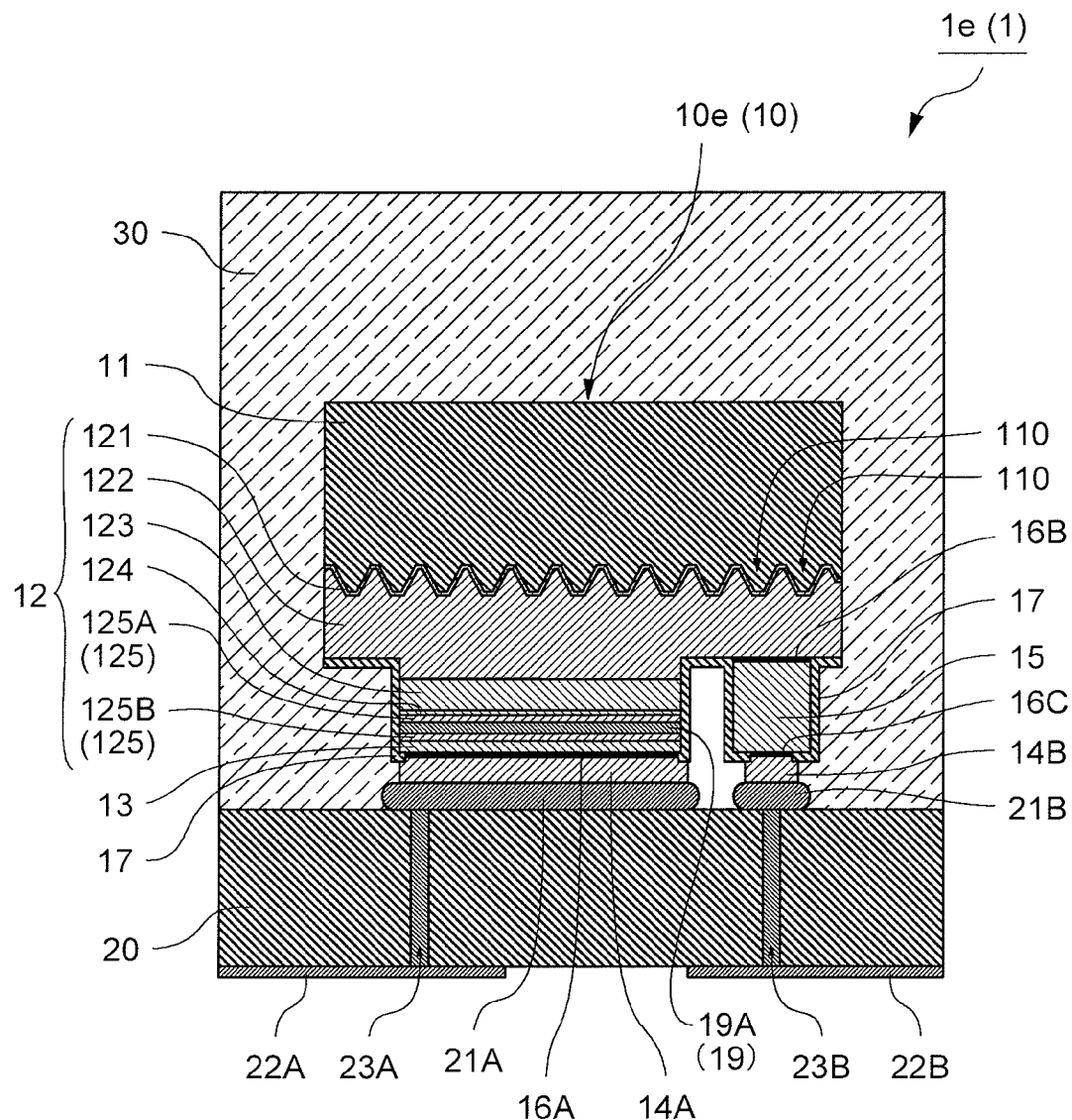
FIG. 9 is a cross-sectional view showing the structure of a nitride semiconductor light-emitting device according to a fifth embodiment.

FIG. 9 is a cross-sectional view showing the structure of a nitride semiconductor light-emitting device according to a fifth embodiment. In a nitride semiconductor light-emitting element 10e of the nitride semiconductor light-emitting device 1e according to the fifth embodiment, for example, the DBR mirror 19A shown in FIG. 8 is provided within the p-type semiconductor layer 125 instead of the second region on the upper surface of the current diffusion layer 13. On the substantially entire region of the upper surface of the current diffusion layer 13, the p-side joining electrode 14A is provided through the highly reflective electrode layer 16A. Except this point, the fifth embodiment is the same as the first or fourth embodiment. The fifth embodiment will be describe below; the same or corresponding portions as or to those of the first and fourth embodiments are identified with like symbols. Their description may not be repeated.

In the fifth embodiment, in the nitride semiconductor light-emitting element 10e, the DBR mirror 19A can be formed in a position closer to the light-emitting layer 124. Hence, the light emitted from the light-emitting layer 124 can be more effectively reflected off the DBR mirror 19A. It is therefore possible to more enhance the efficiency of utilizing the light emitted from the light-emitting layer 124.

In the nitride semiconductor light-emitting element 10e described above and having the DBR mirror 19A, while the p-type semiconductor layer 125 is being deposited so as to have a predetermined thickness, as in the fourth embodiment, the step of forming the sacrifice layer 18 and the step of forming the solid layer 192 are repeatedly performed. Thereafter, the step of removing the sacrifice layer 18 is performed by etching. When the solid layer 192 is formed within the nitride semiconductor layers of the nitride semiconductor multilayer portion 12, a MOCVD method or the like is generally used. Hence, in the fifth embodiment, the sacrifice layer 18 and the solid layer 192 are formed of, for example, a semiconductor material such as a nitride semiconductor $(In_xAl_yGa_{1-x-y}N: 0 \leq x<1, 0 \leq y<1)$.

For example, as in the first and fourth embodiments, a p-type semiconductor layer 125A is deposited to have a predetermined thickness. Thereafter, the sacrifice layer 18 is formed on the upper surface of the p-type semiconductor layer 125A. Then, the solid layer 192 is formed on the surface (for example, the upper surface and the side surface) of the sacrifice layer 18, utilizing photolithography, by sputtering or electron-beam deposition and the lift-off method. Here, on the upper portion or the side of each sacrifice layer 18, openings (unillustrated) for removing the sacrifice layer 18 by etching are provided in the solid layer 192. As described above, the step of forming the sacrifice layer 18 on the formed solid layer 192 and the step of forming the solid layer 192 are repeatedly performed.

Then, desired numbers of sacrifice layers 18 and solid layers 192 are alternately formed in a desired order. Thereafter, the sacrifice layers 18 are removed by wet etching, and thus the air gap layers 191 are formed. Here, an etching solution having an etching rate selectivity for the sacrifice layer 18 and the solid layer 192 is used. Specifically, the etching solution in which an etching rate for the sacrifice layer 18 is higher than that for the solid layer 192 is used to form the air gap layer 191. When wet etching is performed to remove the sacrifice layers 18, wet etching is performed so as to leave the part 18a of the sacrifice layer 18. In this way, within the air gap layer 191, the remaining part 18a of the sacrifice layer 18 can support the layers on and below the air gap layer 191. It is therefore possible to prevent the air gap layer 191 from being easily broken. Furthermore, the semiconductor material is used to form the sacrifice layer 18 and the solid layer 192. Therefore, the remaining part 18a of the sacrifice layer 18 is utilized, and thus it is possible to achieve conductivity between the two solid layers 192 which are formed on and below the air gap layer 191.

As described above, the desired numbers of air gap layers 191 and solid layers 192 are alternately formed in the desired order, and thus the air gap layers 191 pair with the solid layers 192 to form the DBR mirror 19A functioning as the reflective mirror 19. In this way, the DBR mirror 19A is formed, and then a p-type semiconductor layer 125B is deposited again.

The thickness of each air gap layer 191 formed in the fifth embodiment (in other words, the thickness of each sacrifice layer 18) is set at approximately an odd multiple of $\{\lambda_o \times 1/(4n_{air})\}$. Here, $\lambda_o/n_{air}$ represents the wavelength of the light emitted from the light-emitting layer 124 in air. Also, $\lambda_o$ and $n_{air}$ respectively represent the wavelength of the light emitted in vacuum and the refractive index of the air gap layer 191 (that is, the air). In fact, the refractive index of the air is approximately one. Hence, the thickness of each sacrifice layer 18 is set at approximately an odd multiple of $\{\lambda_o \times \frac{1}{4}\}$. The thickness of each solid layer 192 is set at approximately an odd multiple of $\{\lambda_o \times 1/(4n_{sc})\}$. Here, $\lambda_o/n_{sc}$ represents the wavelength of the light emitted from the light-emitting layer 124 in the solid layer 192. Also, $\lambda_o$ and $n_{sc}$ respectively represent the wavelength of the light emitted in vacuum and the refractive index of the solid layer 192. In the fifth embodiment, as the material of the sacrifice layer 18, a semiconductor material that has an etching characteristic significantly different from that of the solid layer 192 is used. As the material of the solid layer 192, a semiconductor material that has a high refractive index contrast for the air gap layer 191 is used.

Figure 10:
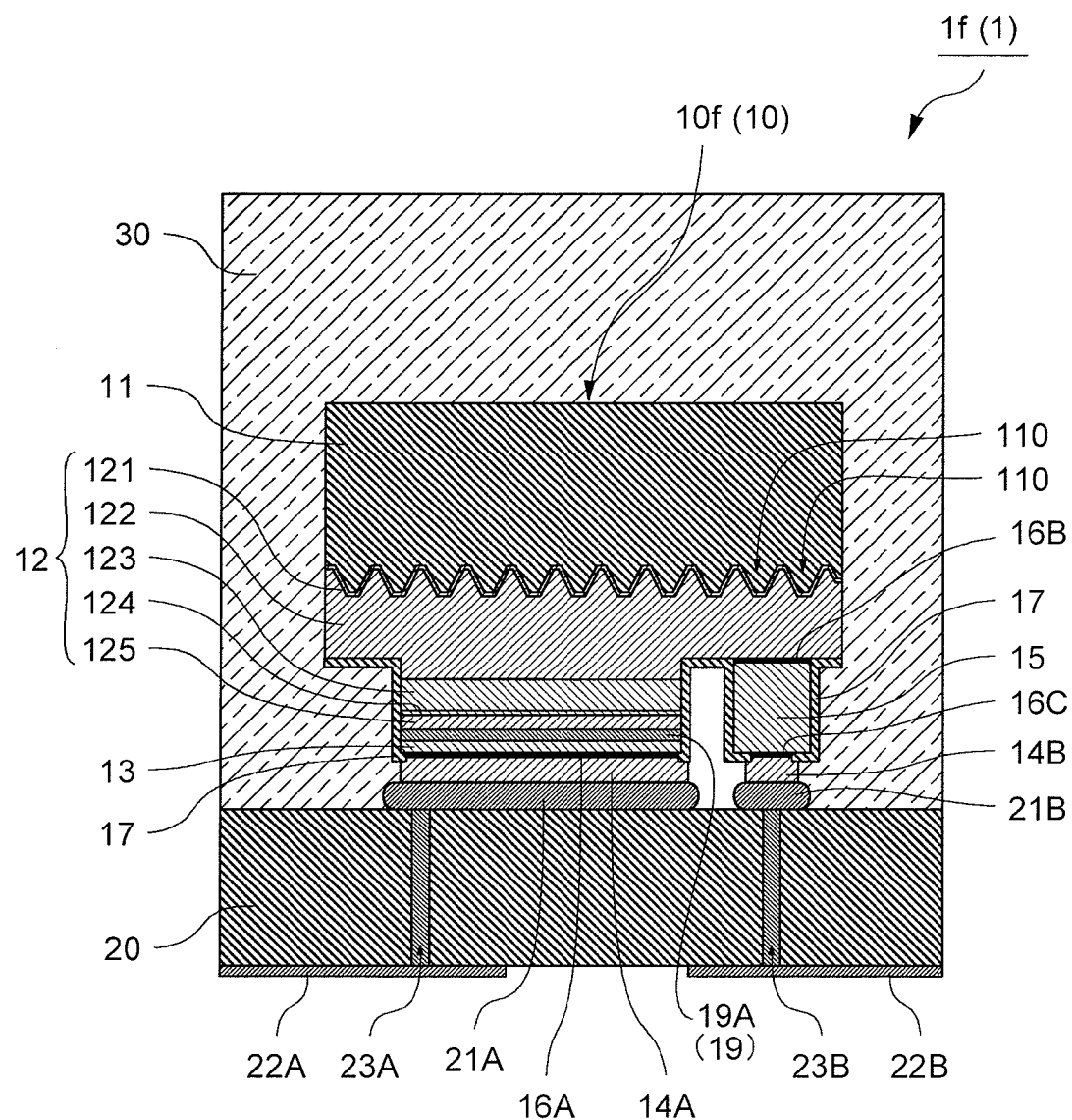
FIG. 10 is a cross-sectional view showing the structure of a nitride semiconductor light-emitting device according to a variation of the fourth embodiment.

In the fifth embodiment, the DBR mirror 19A is formed within the p-type semiconductor layer 125. On the other hand, the present invention is not limited to this configuration. The DBR mirror 19A is preferably formed between the light-emitting layer 124 and the protective layer 17. FIG. 10 is a cross-sectional view showing the structure of a nitride semiconductor light-emitting device according to a variation of the fifth embodiment. In a nitride semiconductor light-emitting element 10f of the nitride semiconductor light-emitting device 1f according to the variation of the fifth embodiment shown in FIG. 10, for example, the DBR mirror 19A shown in FIG. 8 is provided between the p-type semiconductor layer 125 and the current diffusion layer 13 instead of the second region on the upper surface of the current diffusion layer 13. In this way, the DBR mirror 19A can also be formed in a position close to the light-emitting layer 124. Hence, the light emitted from the light-emitting layer 124 can be more effectively reflected off the DBR mirror 19A. It is therefore possible to more enhance the efficiency of utilizing the light emitted from the light-emitting layer 124.

In another variation of the fifth embodiment, as in the second embodiment, in addition to the region on the upper surface of the current diffusion layer 13, on the protective layer 17, the highly reflective electrode layer 16A and the p-side joining electrode 14A may be sequentially provided. Furthermore, in another variation of the fifth embodiment, the same highly reflective film 24 as in the second embodiment may be provided on the main surface of the package substrate 20. In this way, the light emitted from the light-emitting layer 124 is also reflected off the highly reflective electrode layer 16A and the highly reflective film 24 provided on the main surface of the package substrate 20. It is therefore possible to further enhance the efficiency of utilizing the light emitted from the light-emitting layer 124.

Although, as described above, in the first to fifth embodiments described above, in the nitride semiconductor light-emitting element 10, the reflective mirror 19 is provided between the light-emitting layer 124 and the protective layer 17, when the nitride semiconductor light-emitting element 10 is not fillip-chip mounted on the package substrate 20, the reflective mirror 19 may be provided between the substrate 11 and the light-emitting layer 124.

<Sixth Embodiment>

Figure 11:
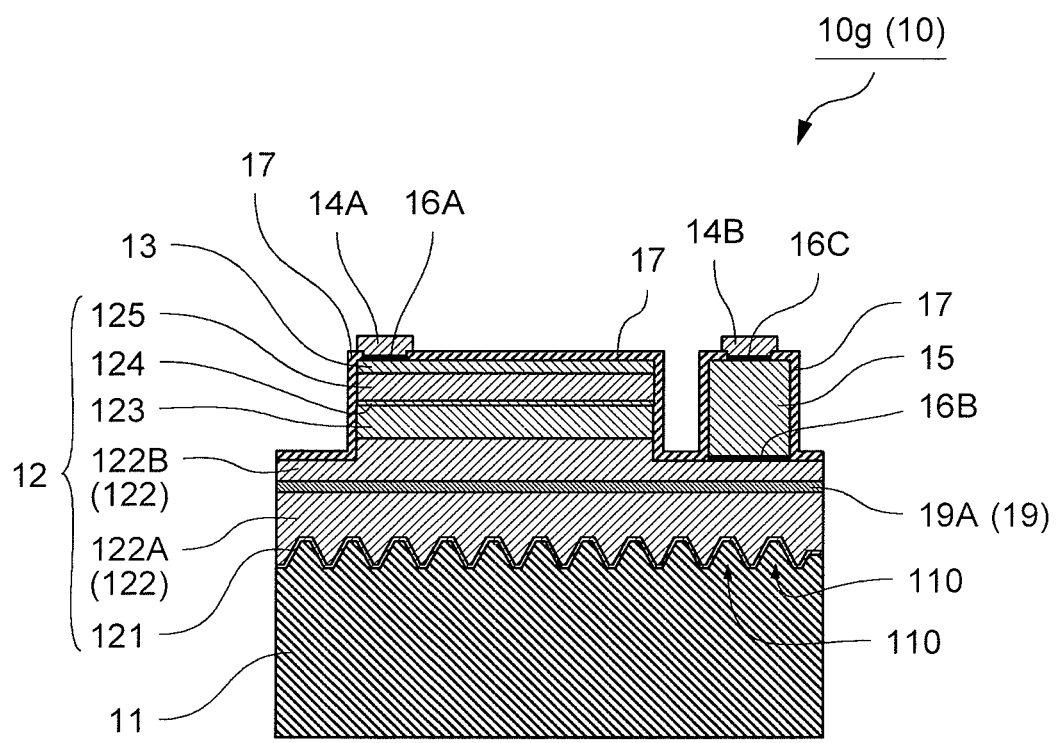
FIG. 11 is a cross-sectional view showing the structure of a nitride semiconductor light-emitting device according to a sixth embodiment.

FIG. 11 is a cross-sectional view showing the structure of a nitride semiconductor light-emitting element according to a sixth embodiment. As shown in FIG. 11, in the nitride semiconductor light-emitting element 10g of the sixth embodiment, for example, the DBR mirror 19A shown in. FIG. 8 is formed within the n-type contact semiconductor layer 122. On the upper surface of the current diffusion layer 13, the protective layer 17 is formed on the region (the second region) other than the region where the highly reflective electrode layer 16A is provided. The configuration of the nitride semiconductor light-emitting element 10g other than what has been described above is the same as that of the nitride semiconductor light-emitting element 10a according to the first embodiment.

In a nitride semiconductor light-emitting device (unillustrated) of the sixth embodiment, the nitride semiconductor light-emitting element 10g is not flip-chip mounted. The nitride semiconductor light-emitting element 10g is mounted on the package substrate 20 using, for example, wiring. Furthermore, the nitride semiconductor light-emitting element 10g is mounted on the package substrate 20 such that, in the direction of the normal to the main surface of the package substrate 20, the DBR mirror 19A of the nitride semiconductor light-emitting element 10g is arranged closer to the side of the package substrate 20 than to the light-emitting layer 124. For example, the nitride semiconductor light-emitting element 10g is mounted on the package substrate 20 such that the main surface of the nitride semiconductor light-emitting element 10g on the side of the substrate 11 is opposite the main surface of the package substrate 20.

In the sixth embodiment, the same or corresponding portions as or to those of the first embodiment are identified with like symbols. Their description may not be repeated.

In the sixth embodiment, in the nitride semiconductor light-emitting element 10g, the DBR mirror 19A can be formed in a position closer to the light-emitting layer 124. Hence, the light emitted from the light-emitting layer 124 can be more effectively reflected off the DBR mirror 19A. It is therefore possible to more enhance the efficiency of utilizing the light emitted from the light-emitting layer 124.

In the nitride semiconductor light-emitting element 10g described above and having the DBR mirror 19A, while the n-type contact semiconductor layer 122 is being deposited so as to have a predetermined thickness, as in the fifth embodiment, the step of forming the sacrifice layer 18 and the step of forming the solid layer 192 are repeatedly performed. Thereafter, the step of removing the sacrifice layer 18 by etching is performed. When the solid layer 192 is formed within the nitride semiconductor layers of the nitride semiconductor multilayer portion 12, the MOCVD method or the like is generally used. Hence, in the sixth embodiment, the sacrifice layer 18 and the solid layer 192 are formed of, for example, a semiconductor material such as a nitride semiconductor ($In_xAl_yGa_{1-x-y}N$: $0 \leq x < 1$, $0 \leq y < 1$).

For example, in a step of depositing the nitride semiconductor multilayer portion 12, an n-type contact semiconductor layer 122A is deposited to have a predetermined thickness. Thereafter, the sacrifice layer 18 is formed on the upper surface of the n-type contact semiconductor layer 122A. Then, the solid layer 192 is formed on the surface (for example, the upper surface and the side surface) of the formed sacrifice layer 18, utilizing photolithography, by sputtering or electron-beam deposition and the lift-off method. Here, on the upper portion or the side of each sacrifice layer 18, openings (unillustrated) for removing the sacrifice layer 18 by etching are provided in the solid layer 192. As described above, the step of forming the sacrifice layer 18 on the formed solid layer 192 and the step of forming the solid layer 192 are repeatedly performed.

Then, desired numbers of sacrifice layers 18 and solid layers 192 are alternately formed in a desired order. Thereafter, the sacrifice layers 18 are removed by wet etching, and thus the air gap layers 191 are formed. Here, an etching solution having an etching rate selectivity for the sacrifice layer 18 and the solid layer 192 is used. Specifically, the etching solution in which an etching rate for the sacrifice layer 18 is higher than that for the solid layer 192 is used to form the air gap layer 191. When wet etching is performed to remove the sacrifice layers 18, the wet etching is performed so as to leave the part 18a of the sacrifice layer 18. In this way, within the air gap layer 191, the remaining part 18a of the sacrifice layer 18 can support the layers on and below the air gap layer 191. It is therefore possible to prevent the air gap layer 191 from being easily broken. Furthermore, the semiconductor material is used to form the sacrifice layer 18 and the solid layer 192. Therefore, the remaining part 18a of the sacrifice layer 18 is utilized, and thus it is possible to achieve conductivity between the two solid layers 192 formed on and below the air gap layer 191.

As described above, the desired numbers of air gap layers 191 and solid layers 192 are alternately formed in the desired order. Thus, the air gap layers 191 pair with the solid layers 192 to form the DBR mirror 19A functioning as the reflective mirror 19. In this way, the DBR mirror 19A is formed, and then an n-type contact semiconductor layer 122B is deposited again.

The thickness of each air gap layer 191 formed in the sixth embodiment (in other words, the thickness of each sacrifice layer 18) is set at approximately an odd multiple of $\{\lambda_o \times 1/(4n_{air})\}$. In fact, the refractive index of the air is approximately one. Hence, the thickness of each sacrifice layer 18 is set at approximately an odd multiple of $\{\lambda_o \times \frac{1}{4}\}$. The thickness of each solid layer 192 is set at approximately an odd multiple of $\{\lambda_o \times 1/(4n_{sc})\}$. In the sixth embodiment, as the material of the sacrifice layer 18, a semiconductor material that has an etching characteristic significantly different from that of the solid layer 192 is used. As the material of the solid layer 192, a semiconductor material that has a high refractive index contrast for the air gap layer 191 is used. If it is possible to acquire a conductive path between the current diffusion layer 13 and the n-side joining electrode 14B, as the materials of the sacrifice layer 18 and the solid layer 192, a dielectric material (especially, a dielectric material having excellent optical characteristics) such as $SiO_2$, $SiN$, $TiO_2$ or like may be used.

In the sixth embodiment, in the nitride semiconductor light-emitting element 10g, the DBR mirror 19A is formed within the n-type contact semiconductor layer 122. On the other hand, the present invention is not limited to this configuration. The DBR mirror 19A is preferably formed between the substrate 11 and the light-emitting layer 124. For example, in a variation of the sixth embodiment, the DBR mirror 19A may be formed between the n-type contact semiconductor layer 122 and the n-type clad layer 123. In this way, the DBR mirror 19A can also be formed in a position close to the light-emitting layer 124. Hence, the light emitted from the light-emitting layer 124 can be more effectively reflected off the DBR mirror 19A. It is therefore possible to more enhance the efficiency of utilizing the light emitted from the light-emitting layer 124.

In another variation of the sixth embodiment, the same highly reflective film 24 as in the third embodiment may be provided on the main surface of the package substrate 20. In this way, the light emitted from the light-emitting layer 124 is also reflected off the highly reflective film 24 provided on the main surface of the package substrate 20. It is therefore possible to further enhance the efficiency of utilizing the light emitted from the light-emitting layer 124.

Although, as described above, in the nitride semiconductor light-emitting device 1 according to the first to sixth embodiments described above, the reflective mirror 19 is provided in the nitride semiconductor light-emitting element 10, the reflective mirror 19 may be provided in the package substrate 20.

<Seventh Embodiment>

Figure 12:
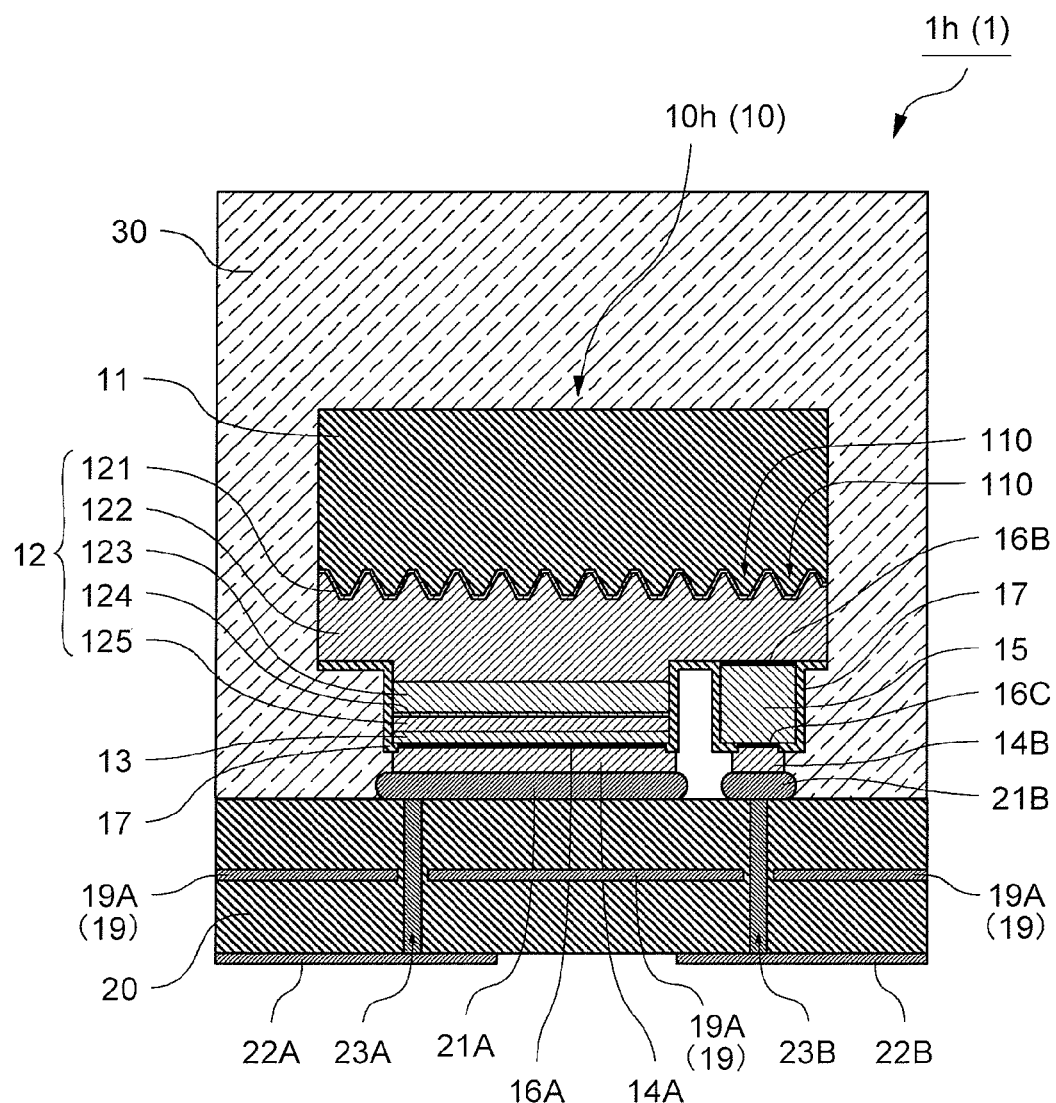
FIG. 12 is a cross-sectional view showing the structure of a nitride semiconductor light-emitting device according to a seventh embodiment.

FIG. 12 is a cross-sectional view showing the structure of a nitride semiconductor light-emitting device according to a seventh embodiment. In the nitride semiconductor light-emitting device 1h of the seventh embodiment, instead of between the light-emitting layer 124 and the protective layer 17 in a nitride semiconductor light-emitting element 10h and between the substrate 11 and the light-emitting layer 124, for example, the DBR mirror 19A shown in FIG. 8 is provided within the package substrate 20. Except this point, the seventh embodiment is the same as the first to sixth embodiments. In the seventh embodiment, the same or corresponding portions as or to those of the first to sixth embodiments are identified with like symbols. Their description will not be repeated.

In the nitride semiconductor light-emitting device 1h, for example, the DBR mirror 19A is provided within the package substrate 20. Hence, the light emitted from the light-emitting layer 124 is reflected off the DBR mirror 19A that is provided in the package substrate 20 and that has a high reflectivity. It is therefore possible to more effectively utilize the light emitted from the light-emitting layer 124.

In the seventh embodiment, the DBR mirror 19A is formed within the package substrate 20. On the other hand, the present invention is not limited to this configuration. For example, the DBR mirror 19A may be provided on the upper surface (the main surface on the side where the bumps 21A and 21B are provided) of the package substrate 20. Alternatively, the DBR mirror 19A may be provided on the back surface (the main surface on the side where the p-side wiring pattern 22A and the n-side wiring pattern 22B are provided) of the package substrate 20.

In a variation of the seventh embodiment, in the nitride semiconductor light-emitting device 1h, as in the second embodiment, in addition to the region on the upper surface of the current diffusion layer 13, on the protective layer 17, the highly reflective electrode layer 16A and the p-side joining electrode 14A may be sequentially provided. Moreover, in a variation of the seventh embodiment, in the nitride semiconductor light-emitting device 1h, the same highly reflective film 24 as in the third embodiment may be further provided on the main surface of the package substrate 20. In this way, the light emitted from the light-emitting layer 124 is reflected off the highly reflective electrode layer 16A of the nitride semiconductor light-emitting device 1h and the highly reflective film 24 provided on the main surface of the package substrate 20. It is therefore possible to further enhance the efficiency of utilizing the light emitted from the light-emitting layer 124.

As described above, in the nitride semiconductor light-emitting device 1 according to the first to seventh embodiments, the reflective mirror 19 is provided in at least one of an area between the light-emitting layer 124 and the protective layer 17 in the nitride semiconductor light-emitting element 10, an area between the substrate 11 and the light-emitting layer 124 and an area in the package substrate. On the other hand, the present invention is not limited to this configuration.

Figure 13:
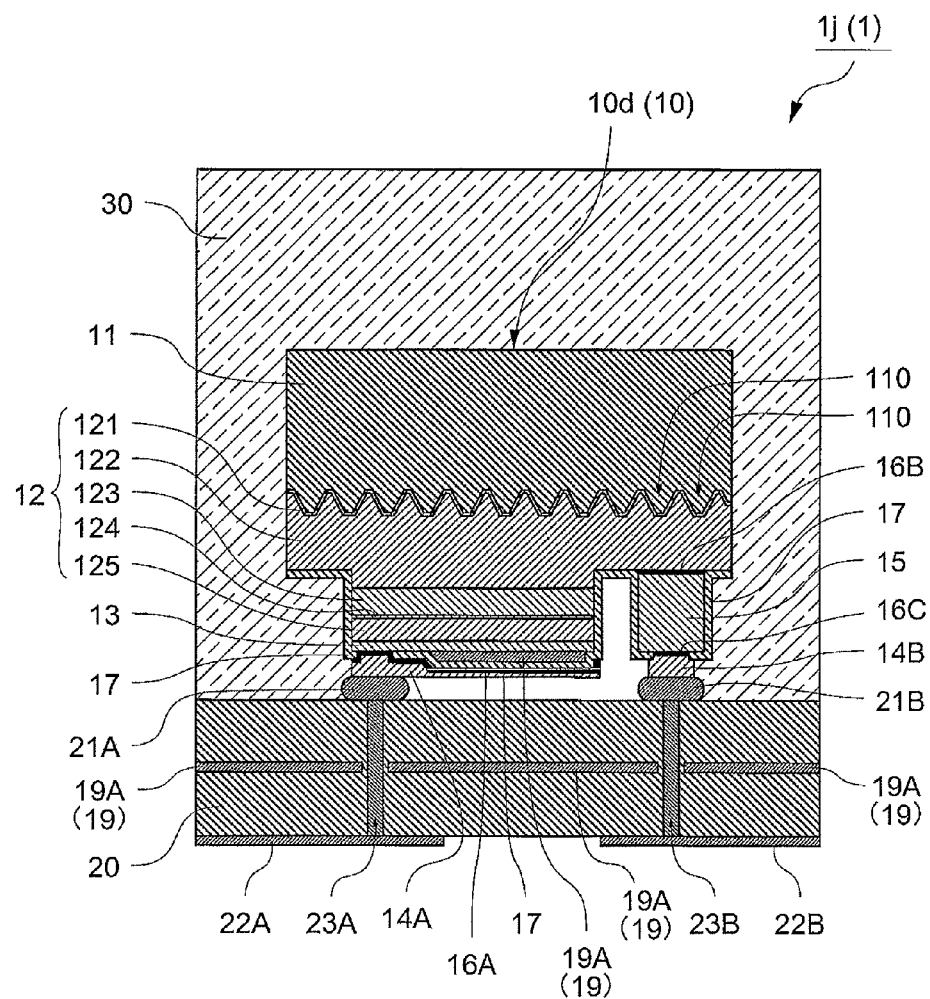
FIG. 13 is a cross-sectional view showing the structure of a nitride semiconductor light-emitting device according to a variation of the seventh embodiment.

The reflective mirror 19 is preferably provided in at least one of the area between the light-emitting layer 124 and the protective layer 17 in the nitride semiconductor light-emitting element 10, the area between the substrate 11 and the light-emitting layer 124 and the area in the package substrate. For example, as shown in FIG. 13, the reflective mirror 19 may be provided between the light-emitting layer 124 and the protective layer in 17 in the nitride semiconductor light-emitting element 10 and may be provided in the package substrate 20. In the nitride semiconductor light-emitting element 10, the reflective mirror 19 may be provided both between the light-emitting layer 124 and the protective layer 17 and between the substrate 11 and the light-emitting layer 124. In this way, in the nitride semiconductor light-emitting element 10, the light emitted from the light-emitting layer 124 can be reflected off the reflective mirror 19 formed between the light-emitting layer 124 and the protective layer 17 and the reflective mirror 19 formed between the substrate 11 and the light-emitting layer 124. It is therefore possible to further enhance the efficiency of utilizing the light emitted from the light-emitting layer 124.

For example, the reflective mirror 19 may be provided, as in the first to sixth embodiments, on the nitride semiconductor light-emitting element 10 and may also be provided, as in the seventh embodiment, in the package substrate 20. In this way, the light emitted from the light-emitting layer 124 can be reflected off the reflective mirror 19 provided between the light-emitting layer 124 and the protective layer 17 and the reflective mirror 19 provided between the substrate 11 and the light-emitting layer 124. It is therefore possible to further enhance the efficiency of utilizing the light emitted from the light-emitting layer 124.

In the nitride semiconductor light-emitting device 1 according to the first to seventh embodiments, in the nitride semiconductor light-emitting element 10, the n-type contact semiconductor layer 122 and the n-type clad layer 123 are provided, as the first nitride semiconductor layer, between the substrate 11 and the light-emitting layer 124. Furthermore, the p-type semiconductor layer 125 is provided, as the second nitride semiconductor layer, on the light-emitting layer 124. On the other hand, the present invention is not limited to this configuration. In the first to seventh embodiments, in the nitride semiconductor light-emitting element 10, a p-type contact semiconductor layer and a p-type clad layer may be provided, as the first nitride semiconductor layer, between the substrate 11 and the light-emitting layer 124. Furthermore, the n-type semiconductor layer may be provided, as the second nitride semiconductor layer, on the light-emitting layer 124.

The description has been given based on the embodiments of the present invention. The embodiments are illustrative; those skilled in the art understand that many variations of the combinations of the components and the types of processing are possible, and that they are within the scope of the present invention.

The present invention can be utilized for nitride semiconductor laser elements, light-emitting elements such as a LED, light-emitting devices on which light-emitting elements are mounted and the like.

What is claimed is:

1. A nitride semiconductor light-emitting element comprising:
    a substrate;
    a nitride semiconductor multilayer portion provided on the substrate; and
    a current diffusion layer provided on the nitride semiconductor multilayer portion,
    wherein the nitride semiconductor multilayer portion includes a light-emitting layer, and
    an air gap layer is formed in one of an area between the substrate and the light-emitting layer, an area between the light-emitting layer and the current diffusion layer and an area on an upper surface of the current diffusion layer, and
    a thickness of the air gap layer is approximately an odd multiple of one-fourth of a wavelength of light emitted from the light-emitting layer.

2. The nitride semiconductor light-emitting element of claim 1, further comprising:
    a protective layer provided on the current diffusion layer,
    wherein the air gap layer is provided between the current diffusion layer and the protective layer.

3. The nitride semiconductor light-emitting element of claim 1,
    wherein the nitride semiconductor multilayer portion further includes: a first nitride semiconductor layer provided between the substrate and the light-emitting layer; and a second nitride semiconductor layer provided between the light-emitting layer and the current diffusion layer, and
    the air gap layer is formed in one of an area within the first nitride semiconductor layer and an area within the second nitride semiconductor layer.

4. The nitride semiconductor light-emitting element of claim 1, further comprising:
    a solid layer that is provided adjacent to the air gap layer in a direction of a normal to a main surface of the light-emitting layer,
    wherein the solid layer has a high refractive index contrast for the air gap layer, and pairs with the air gap layer to form a reflective mirror.

5. The nitride semiconductor light-emitting element of claim 1, further comprising:
    a joining electrode provided on an upper portion of the nitride semiconductor multilayer portion; and
    a first highly reflective electrode layer provided between the nitride semiconductor multilayer portion and the joining electrode.

6. The nitride semiconductor light-emitting element of claim 1,
    wherein the nitride semiconductor multilayer portion further includes a first nitride semiconductor layer provided between the substrate and the light-emitting layer, and
    the nitride semiconductor light-emitting element further comprises:
    a contact electrode provided on an upper portion of the first nitride semiconductor layer; and
    a second highly reflective electrode layer provided between the first nitride semiconductor layer and the contact electrode.

7. A nitride semiconductor light-emitting device comprising:

a nitride semiconductor light-emitting element including: a substrate; a nitride semiconductor multilayer portion provided on the substrate and having a light-emitting layer; and a current diffusion layer provided on the nitride semiconductor multilayer portion;

a package substrate on which the nitride semiconductor light-emitting element is mounted; and an optically transparent resin sealing portion that seals the nitride semiconductor light-emitting element mounted on the package substrate, wherein an air gap layer is formed in at least one of an area between the substrate and the light-emitting layer in the nitride semiconductor light-emitting element, an area between the light-emitting layer and the current diffusion layer in the nitride semiconductor light-emitting element and an area on an upper surface of the current diffusion layer, and/or formed in an area in the package substrate, a thickness of the air gap layer is approximately an odd multiple of one-fourth of a wavelength of light emitted from the light-emitting layer.

* * * * *